(12) United States Patent
Ohtou et al.

(10) Patent No.: US 10,790,381 B2
(45) Date of Patent: Sep. 29, 2020

(54) SEMICONDUCTOR DEVICE AND MANUFACTURING METHOD THEREOF

(71) Applicant: TAIWAN SEMICONDUCTOR MANUFACTURING CO., LTD., Hsinchu (TW)

(72) Inventors: Tetsu Ohtou, Hsinchu (TW); Yusuke Oniki, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/725,537

(22) Filed: Dec. 23, 2019

(65) Prior Publication Data

US 2020/0135902 A1    Apr. 30, 2020

Related U.S. Application Data

(63) Continuation of application No. 16/049,013, filed on Jul. 30, 2018, now Pat. No. 10,516,038, which is a
(Continued)

(51) Int. Cl.
*H01L 29/66* (2006.01)
*H01L 29/78* (2006.01)
(Continued)

(52) U.S. Cl.
CPC ............ *H01L 29/66795* (2013.01); *H01L 21/823431* (2013.01); *H01L 21/823821* (2013.01);
(Continued)

(58) Field of Classification Search
CPC .................. H01L 29/7855; H01L 29/7856
(Continued)

(56) References Cited

U.S. PATENT DOCUMENTS 9,698,230 B2    7/2017 Cheng et al.
2006/0071275 A1  4/2006 Brask et al.
(Continued)

OTHER PUBLICATIONS

German Office Action issued in corresponding German Patent Application No. 10 2017 110 846.7, dated Nov. 14, 2017.
(Continued)

*Primary Examiner* — David Vu
*Assistant Examiner* — Brandon C Fox
(74) *Attorney, Agent, or Firm* — McDermott Will & Emery LLP

(57) ABSTRACT

In a method for manufacturing a semiconductor device by using a gate replacement technology, a gate space constituted by dielectric material portions, in which a semiconductor fin channel layer is exposed, is formed. The surfaces of the dielectric material portions are made hydrophobic. A first dielectric layer is formed on the semiconductor fin channel layer, while maintaining the surfaces of the dielectric material portions hydrophobic. A surface of the formed first dielectric layer is hydrophilic. A first conductive layer is formed over the first dielectric layer, while maintaining the surfaces of the dielectric material portions hydrophobic. A second conductive layer is formed over the first conductive layer and on the hydrophobic surfaces of the dielectric material portions, thereby filling the gate space.

20 Claims, 30 Drawing Sheets

Related U.S. Application Data continuation of application No. 15/481,672, filed on Apr. 7, 2017, now Pat. No. 10,038,079.

(51) Int. Cl.
  *H01L 21/8234* (2006.01)
  *H01L 21/8238* (2006.01)
  *H01L 21/84* (2006.01)
  *H01L 29/417* (2006.01)

(52) U.S. Cl.
  CPC ...... *H01L 21/845* (2013.01); *H01L 29/41791* (2013.01); *H01L 29/66545* (2013.01); *H01L 29/785* (2013.01); *H01L 29/7831* (2013.01); *H01L 29/7855* (2013.01); *H01L 29/7856* (2013.01); *H01L 29/6681* (2013.01); *H01L 2029/7858* (2013.01)

(58) Field of Classification Search
  USPC .......................................................... 257/347
  See application file for complete search history.

(56) References Cited

U.S. PATENT DOCUMENTS

| | | |
|---|---|---|
| 2009/0085169 A1 | 4/2009 | Rachmady et al. |
| 2009/0272965 A1 | 11/2009 | Rachmady et al. |
| 2013/0277743 A1* | 10/2013 | Jagannathan ....... H01L 29/4958 257/347 |
| 2015/0137271 A1 | 5/2015 | Cai et al. |
| 2015/0228762 A1 | 8/2015 | He et al. |
| 2015/0294863 A1 | 10/2015 | Nemani et al. |
| 2016/0093711 A1* | 3/2016 | Hong ................ H01L 29/66795 257/407 |
| 2016/0149016 A1 | 5/2016 | Farmer et al. |
| 2017/0133278 A1 | 5/2017 | Bao et al. |
| 2017/0148682 A1 | 5/2017 | Basker et al. |
| 2017/0170175 A1 | 6/2017 | Chang et al. |
| 2018/0323101 A1 | 11/2018 | Maestre Caro et al. |
| 2018/0331096 A1 | 11/2018 | Ando et al. |

OTHER PUBLICATIONS

Non-Final Office Action issued in related parent U.S. Appl. No. 15/481,672, dated Nov. 7, 2017.
Notice of Allowance issued in related parent U.S. Appl. No. 15/481,672, dated Apr. 3, 2018.
Non-final Office Action issued in U.S. Appl. No. 16/049,013, dated Apr. 19, 2019.
Notice of Allowance issued in U.S. Appl. No. 16/049,013, dated Nov. 4, 2019.

* cited by examiner

| SAM | Structural formula | SAM | Structural formula |
|---|---|---|---|
| PETS (phenylethyltrichlorosilane) | | UDT (undecanethiol) | HS⁀⁀⁀⁀OH |
| MPTMS (mercaptopropyltrimethoxysilane) | | MUDO (mercaptoundecanol) | HS⁀⁀⁀⁀OH |
| FDTS (perfluorodercyltrichlorosilane) | | CYS (cysteamine) | H2N⁀⁀SH |
| AMPTS (aminopropyltrimethoxysilane) | | DDT (dodecanethiol) | H3C⁀⁀⁀⁀SH |
| UTS (undecyltrichlorosilane) | | APTES (aminopropyltriethoxysilane) | |
| MPT (methylpropanethiol) | | EDA (aminoethylaminopropyltrimethoxysilane) | |
| ODT (octadecanethiol) | | DETA (trimethoxysilylpropyldiethylenetriamine) | |
| HDT (hexadecanethiol) | | PEDA (aminoethylaminomethylphenethyltrimethoxysilane) | |
| MHDA (mercaptohexadecanoic acid) | HSCH2(CH2)13CH2⁀COOH | TMSDMA (tetramethylsilyldiethylamine) | |
| MUDA (mercaptoundecanoic acid) | HSCH2(CH2)8CH2⁀COOH | HMDS (hexamethyldisilazane) | |

FIG. 12

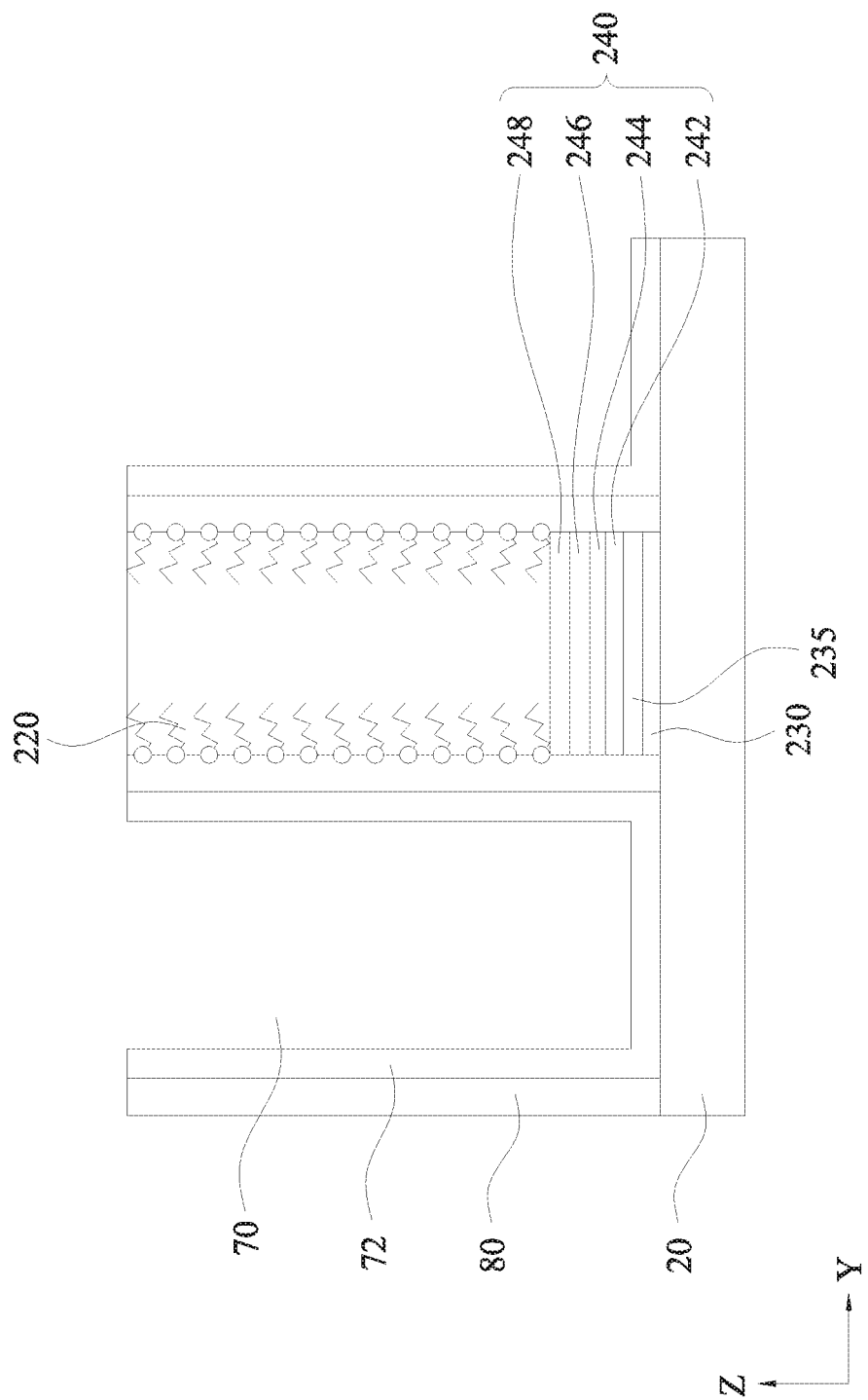

SEMICONDUCTOR DEVICE AND MANUFACTURING METHOD THEREOF

CROSS-REFERENCE TO RELATED APPLICATIONS

This application is a Continuation Application of U.S. patent application Ser. No. 16/049,013, filed Jul. 30, 2018, now U.S. Pat. No. 10,516,038, which is a Continuation Application of U.S. patent application Ser. No. 15/481,672, filed Apr. 7, 2017, now U.S. Pat. No. 10,038,079, the entire disclosure of each of which is incorporated herein by reference.

TECHNICAL FIELD

The disclosure relates to semiconductor integrated circuits, and more particularly to semiconductor devices having metal gate structures and their manufacturing process.

BACKGROUND

As the semiconductor industry has progressed into nanometer technology process nodes in pursuit of higher device density, higher performance, and lower costs, challenges from both fabrication and design issues have resulted in the development of three-dimensional designs, such as a fin field effect transistor (Fin FET). Fin FET devices typically include semiconductor fins with high aspect ratios and in which channel and source/drain regions of semiconductor transistor devices are formed. A gate is formed over and along the sides of the fin structures (e.g., wrapping) utilizing the advantage of the increased surface area of the channel and source/drain regions to produce faster, more reliable and better-controlled semiconductor transistor devices. A metal gate structure together with a high-k gate dielectric having a high dielectric constant is often used in Fin FET device, and is fabricated by a gate-replacement technology.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIG. 1A is an exemplary plan view, FIG. 1B is an exemplary perspective view, and FIGS. 1C and 1D are exemplary cross sectional views.

FIG. 5A is an exemplary cross sectional view, FIG. 5B is an exemplary plan view and FIG. 5C is an exemplary perspective view.

FIG. 6A is an exemplary cross sectional view and FIG. 6B is an exemplary plan view.

FIG. 7A is an exemplary cross sectional view and FIG. 7B is an exemplary plan view.

FIGS. 8A and 8C are exemplary cross sectional views and FIG. 8B is an exemplary plan view.

FIG. 12 shows examples of compounds for a self-assembled-monolayer.

FIGS. 15A and 15B are exemplary cross sectional views of one of the various stages of a sequential semiconductor device manufacturing process according to some embodiments of the present disclosure.

DETAILED DESCRIPTION

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. In addition, the term "made of" may mean either "comprising" or "consisting of."

Figure 1A:
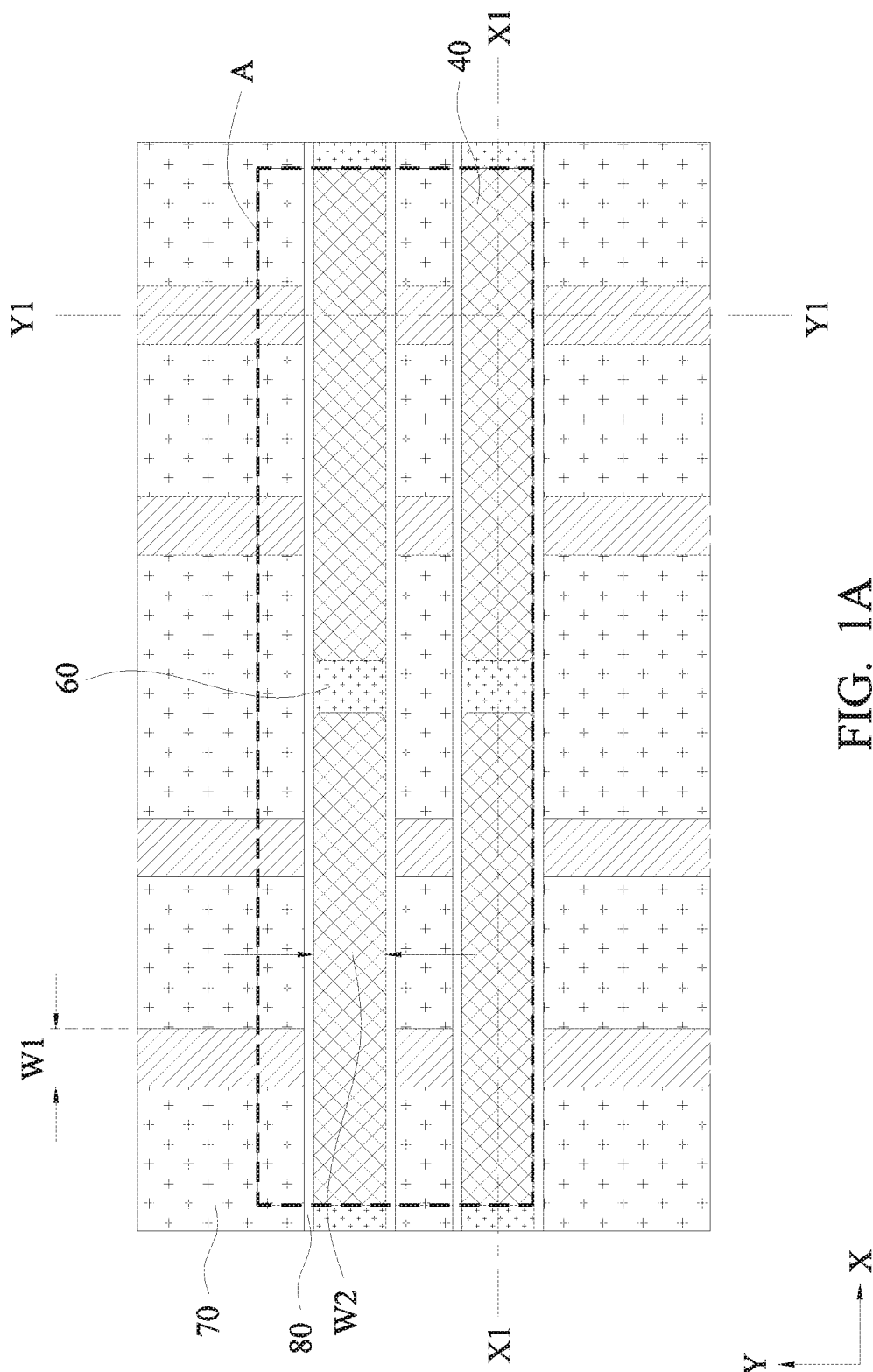
FIGS. 1A-1D show exemplary views of a semiconductor device according to some embodiments of the present disclosure.
Figure 1B:
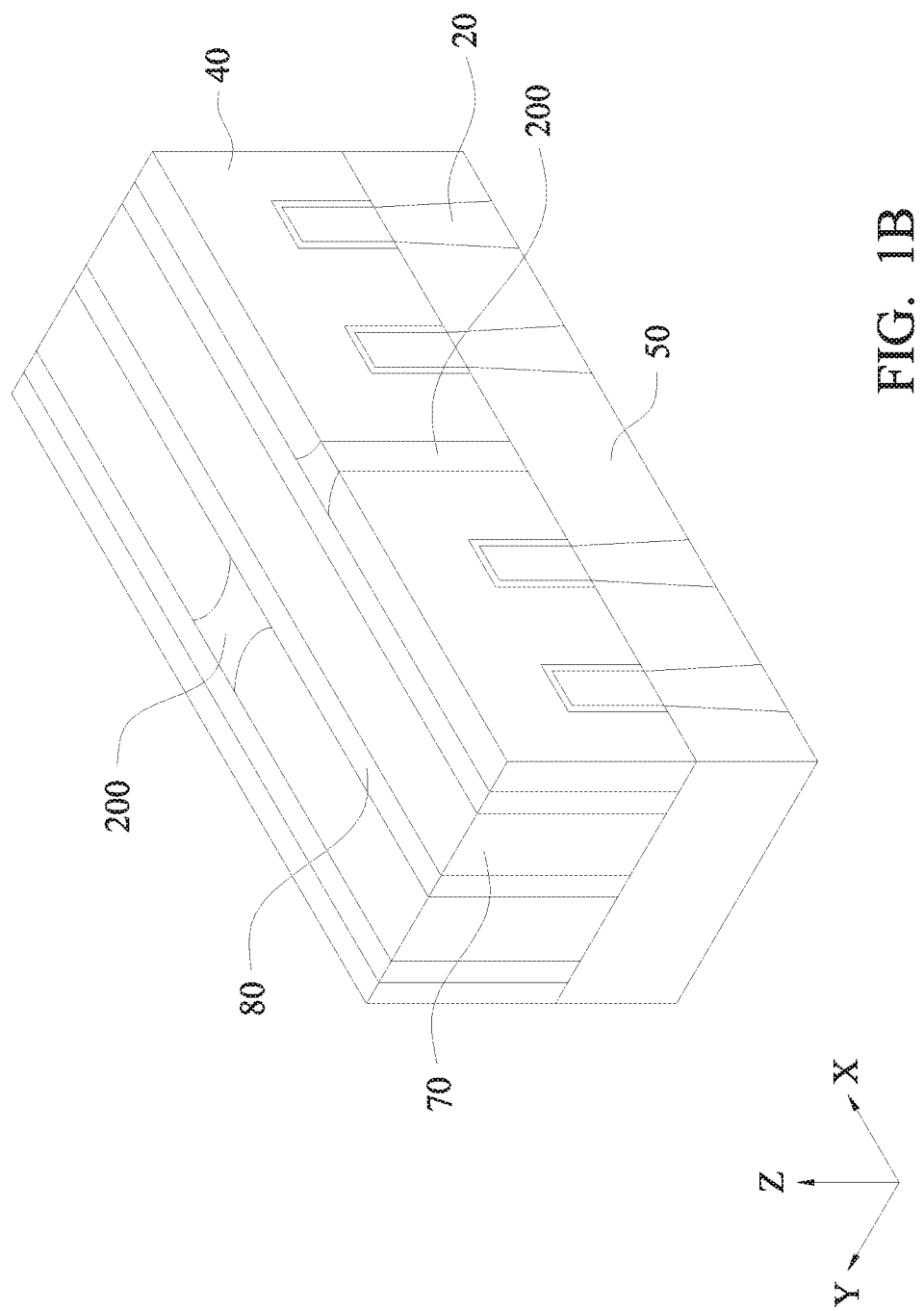
Figure 1C:
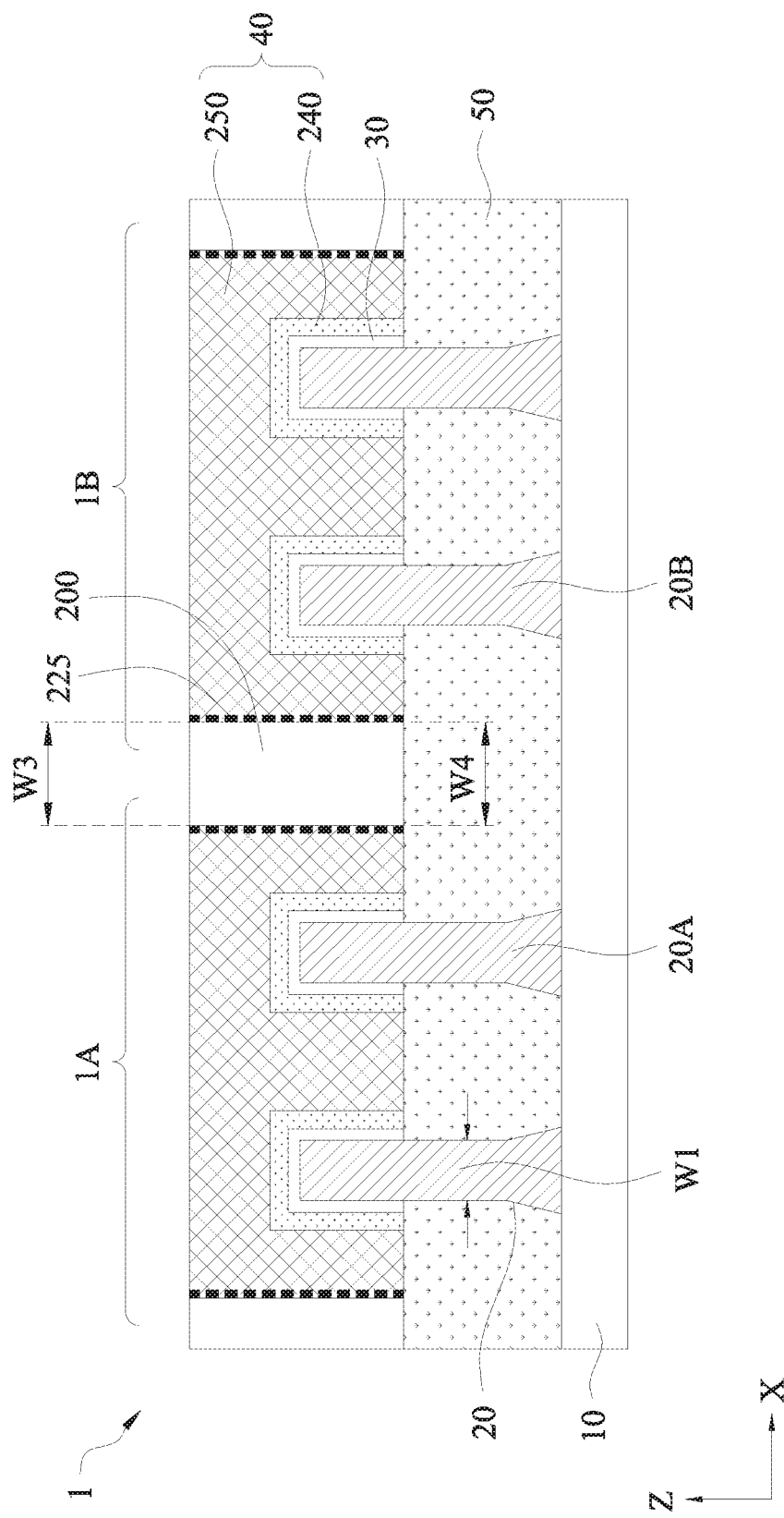

FIGS. 1A-1D show exemplary views of a semiconductor device according to some embodiments of the present disclosure. FIG. 1A is an exemplary plan view, FIG. 1B is an exemplary perspective view, FIG. 1C is an exemplary cross sectional view along line X1-X1 of FIG. 1A, and FIG. 1D an exemplary cross sectional view along line Y1-Y1 of FIG. 1A. FIG. 1B corresponds to the enclosed portion A in FIG. 1A.

As show in FIGS. 1A-1D, a semiconductor device such as a fin field effect transistor (Fin FET) includes a first device region 1A and a second device region 1B. The first device region 1A includes one or more first Fin FETs, and the second device region includes one or more second Fin FETs. A channel type of the first Fin FET is the same as or different from a channel type of the second Fin FET.

In one embodiment, the first device region 1A includes p-type MOS FETs and the second device region 1B includes n-type MOS FETs. In other embodiments, the first and second device regions include p-type MOS FETs, the first and second device regions include n-type MOS FETs or the first and second device regions include both p-type and n-type MOS FETs.

The FinFET includes, among other features, a substrate 10, fin structures 20, a gate dielectric layer 30 and a gate electrode 40. In one embodiment, the substrate 10 is a silicon substrate. Alternatively, the substrate 10 may comprise another elementary semiconductor, such as germanium; a compound semiconductor including Group IV-IV compound semiconductors such as SiC and SiGe, Group III-V compound semiconductors such as GaAs, GaP, GaN, InP, InAs, InSb, GaAsP, AlGaN, AlInAs, AlGaAs, GaInAs, GaInP, and/or GaInAsP; or combinations thereof. Amorphous substrates, such as amorphous Si or amorphous SiC, or insulating material, such as silicon oxide may also be used as the substrate 10. The substrate 10 may include various regions that have been suitably doped with impurities (e.g., p-type or n-type conductivity).

The fin structure 20 is disposed over the substrate 10. The fin structure 20 may be made of the same material as the substrate 10 and may continuously extend from the substrate 10. In one embodiment, the fin structure is made of Si. The silicon layer of the fin structure 20 may be intrinsic, or appropriately doped with an n-type impurity or a p-type impurity.

In FIGS. 1A-1C, two fin structures 20 are disposed in the first device region 1A and in the second device region 1B, respectively. However, the number of the fin structures is not limited to two (or four). The numbers may be one, two, three or five or more. In addition, one of more dummy fin structures may be disposed adjacent both sides of the fin structures 20 to improve pattern fidelity in patterning processes. The width W1 of the fin structure 20 is in a range of about 5 nm to about 40 nm in some embodiments, and is in a range of about 7 nm to about 15 nm in certain embodiments. The height of the fin structure 20 is in a range of about 100 nm to about 300 nm in some embodiments, and is in a range of about 50 nm to 100 nm in other embodiments.

Further, spaces between the fin structures 20 and/or a space between one fin structure and another element formed over the substrate 10 are filled by an isolation insulating layer 50 (or so-called a "shallow-trench-isolation (STI)" layer) including an insulating material, and an interlayer dielectric layer 70 is disposed over the isolation insulating layer 50. The insulating material for the isolation insulating layer 50 and the interlayer dielectric layer 70 may include silicon oxide, silicon nitride, silicon oxynitride (SiON), SiOCN, fluorine-doped silicate glass (FSG), or a low-K dielectric material. The insulating material for the isolation insulating layer 50 may be the same as or different from that for the interlayer dielectric layer 70.

The lower part of the fin structure 20 under the gate electrode 40 is referred to as a well layer, and the upper part of the fin structure 20 is referred to as a channel layer or a channel region. Under the gate electrode 40, the well layer is embedded in the isolation insulating layer 50, and the channel layer protrudes from the isolation insulating layer 50. A lower part of the channel layer may also be embedded in the isolation insulating layer 50 to a depth of about 1 nm to about 5 nm.

The height of the well layer is in a range of about 60 nm to 100 nm in some embodiments, and the height of the channel layer is in a range of about 40 nm to 60 nm.

The channel layer of the fin structure 20 protruding from the isolation insulating layer 50 is covered by a gate dielectric layer 30, and the gate dielectric layer 30 is further covered by a gate electrode 40. Part of the channel layer not covered by the gate electrode 40 functions as a source and/or drain of the MOS FET (see, FIG. 1B). The fin structures 20 extend in a first direction and the gate electrodes 40 extends in a second direction perpendicular to the first direction.

In certain embodiments, the gate dielectric layer 30 includes an interfacial layer 230 and a high-k dielectric layer 235. The interfacial layer 230 is made of, for example, silicon oxide. The high-k dielectric layer 235 is made of one or more layers of $HfO_2$, HfSiO, HfSiON, HfTaO, $La_2O_3$, HfTiO, HfZrO, zirconium oxide, aluminum oxide, titanium oxide, hafnium dioxide-alumina ($HfO_2$—$Al_2O_3$), other suitable high-k dielectric materials.

The gate electrode 40 includes one or more conductive underlying layers 240 and a main electrode layer 250. The main electrode layer 250 includes one or more layers of aluminum, copper, titanium, tantalum, tungsten, cobalt, molybdenum, nickel, alloys thereof, or other suitable conductive material.

The one or more conductive underlying layers 240 includes one or more work function adjustment layers, one or more barrier layers, one or more adhesion layers, and/or one or more liner layers. The work function adjustment layer includes one or more layers made of Ti, Ag, Al, TiAlN, TaC, TaCN, TaSiN, Mn, Zr, TiN, TaN, Ru, Mo, Al, WN, Cu, W, Re, Ir, Co, Ni, other suitable conductive material. In some embodiments, the work function adjustment layer may include a first metal material for the p-channel Fin FET (e.g., in the first device region 1A) and a second metal material for the n-channel Fin FET (e.g., in the second device region 1B). The work function adjustment layer may be formed by ALD, PVD, CVD, e-beam evaporation, or other suitable process. Further, the work function adjustment layer may be formed separately for the n-channel Fin FET and the p-channel Fin FET which may use different metal layers.

The one or more barrier layers, adhesion layers, and/or liner layers include Ti, TiN, Ta and/or TaN.

Source and drain regions are also formed in the fin structure not covered by the gate electrode 40, by appropriately doping impurities in the source and drain regions, and/or by forming one or more epitaxial layers. An alloy of Si or Ge and a metal such as Co, Ni, W, Ti or Ta may be formed on the source and drain regions.

Further, side-wall insulating layers 80 are disposed at opposing side faces of the gate electrode 40. The gate electrode 40 and the source/drain regions are covered by the interlayer dielectric layer 70, and necessary wirings and/or via/contact holes are disposed so as to complete the semiconductor device.

The width W2 of the gate electrode 40 is in a range of about 20 nm to 40 nm in some embodiments. When plural gate electrodes 40 are arranged in the width direction (see, FIG. 1B), a pitch of the gate electrodes is in a range of about 60 nm to 100 nm in some embodiments.

As shown in FIGS. 1A-1C, adjacent gate electrodes 40 are separated from each other by a separation plug 200 made of an insulating material. In some embodiments, the separation plug 200 has a tapered shape having a smaller top size (width) and a larger bottom size (width). In other embodiments, the separation plug 200 has a reverse tapered shape having a larger top size (width) and a smaller bottom size (width).

The width W3 at the top of the separation plug is less than about 20 nm in certain embodiments and may be in a range of about 5 nm to about 15 nm in some embodiments. The width W4 at the bottom of the separation plug is less than about 35 nm in certain embodiments and may be in a range of about 10 nm to about 30 nm in some embodiments. In some embodiments, the top of the separation plug corresponds to the upper surface of the gate electrode 40 and the bottom of the separation plug 200 corresponds to the bottom of the gate dielectric layer 30 or the interface between the isolation insulating layer 50 and the interlayer dielectric layer 70. The insulating material for the separation plug 200 may include silicon oxide, silicon nitride, silicon oxynitride (SiON), SiOCN, fluorine-doped silicate glass (FSG), or a low-k dielectric material, and may be the same as or different from the materials for the insulating material for the isolation insulating layer 50 and/or the interlayer dielectric layer 70. In some embodiments, the separation plug 200 is made of a silicon nitride based material, such as SiN, SiON, SiCN or SiOCN.

Figure 1D:
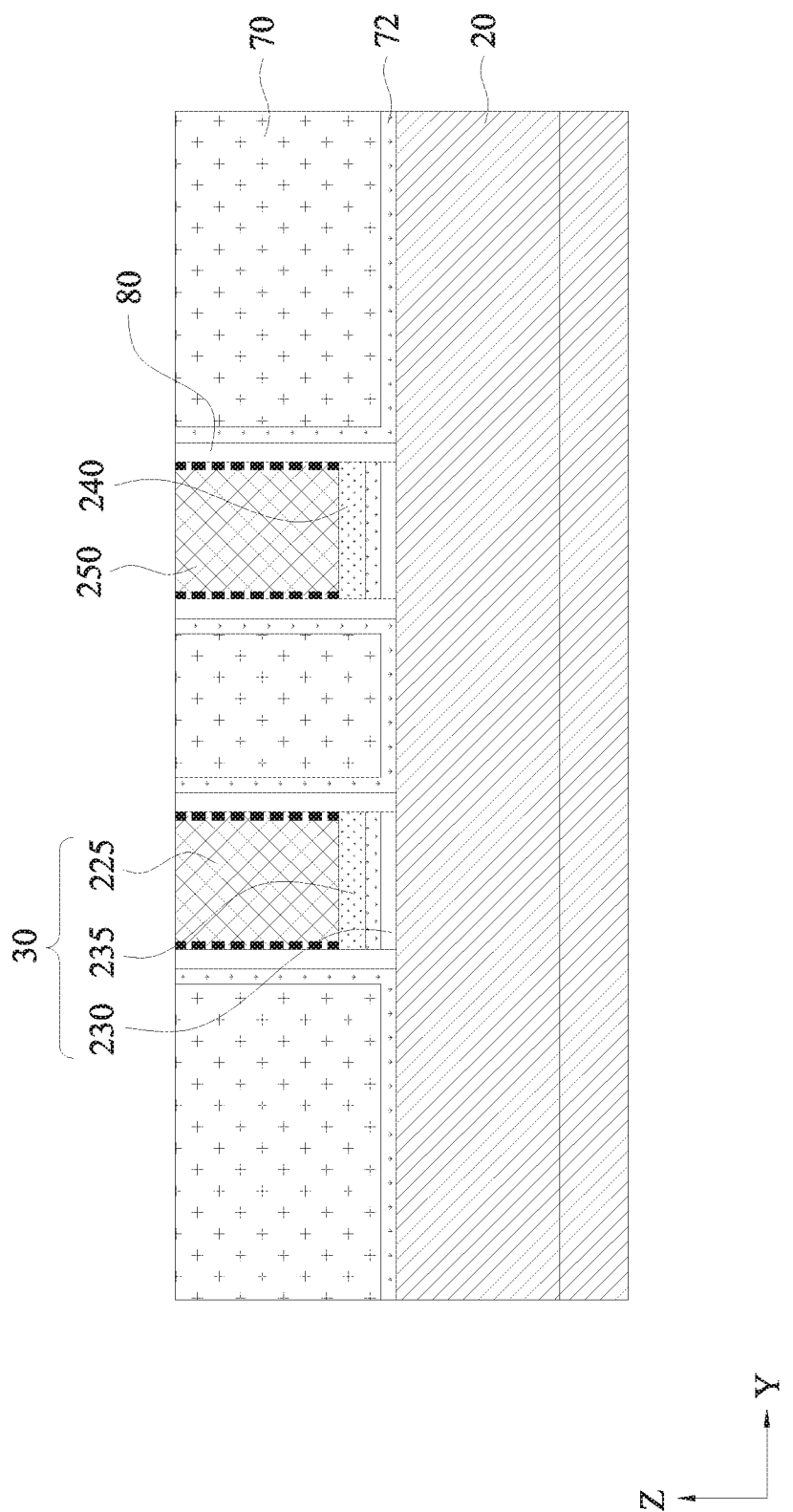

As shown in FIGS. 1C and 1D, at least one of sulfur, N—H, C—H and atomic Si (not Si atoms constituting the separation plug 200) is disposed, as a self-assembled monolayer (SAM) residue 225, at an interface between the main electrode layer 250 and the separation plug 200 (FIG. 1DC) and/or at an interface between the main electrode layer 250 and the sidewall spacers 80 (FIG. 1D).

FIGS. 2-10B and 13A-15B show exemplary sequential processes of manufacturing the FinFET according to some embodiments of the present disclosure. It is understood that additional operations can be provided before, during, and after processes shown by FIGS. 2-10B and 13A-15B, and some of the operations described below can be replaced or eliminated, for additional embodiments of the method. The order of the operations/processes may be interchangeable.

To fabricate a fin structure, a mask layer is formed over the substrate (e.g., a semiconductor wafer) by, for example, a thermal oxidation process and/or a chemical vapor deposition (CVD) process. The substrate is, for example, a p-type silicon substrate with an impurity concentration being in a range from about $1\times10^{15}$ cm$^{-3}$ and about $5\times10^{15}$ cm$^{-3}$. In other embodiments, The substrate is an n-type silicon substrate with an impurity concentration being in a range from about $1\times10^{15}$ cm$^{-3}$ and about $5\times10^{15}$ cm$^{-3}$. The substrate 10 may include various regions that have been suitably doped with impurities (e.g., p-type or n-type conductivity).

The mask layer includes, for example, a pad oxide (e.g., silicon oxide) layer and a silicon nitride mask layer in some embodiments. The pad oxide layer may be formed by using thermal oxidation or a CVD process. The silicon nitride mask layer may be formed by a physical vapor deposition (PVD), such as sputtering method, a CVD, plasma-enhanced chemical vapor deposition (PECVD), an atmospheric pressure chemical vapor deposition (APCVD), a low-pressure CVD (LPCVD), a high density plasma CVD (HDPCVD), an atomic layer deposition (ALD), and/or other processes.

The thickness of the pad oxide layer is in a range from about 2 nm to about 15 nm and the thickness of the silicon nitride mask layer is in a range from about 2 nm to about 50 nm in some embodiments. A mask pattern is further formed over the mask layer. The mask pattern is, for example, a photo resist pattern formed by photo lithography.

Figure 2:
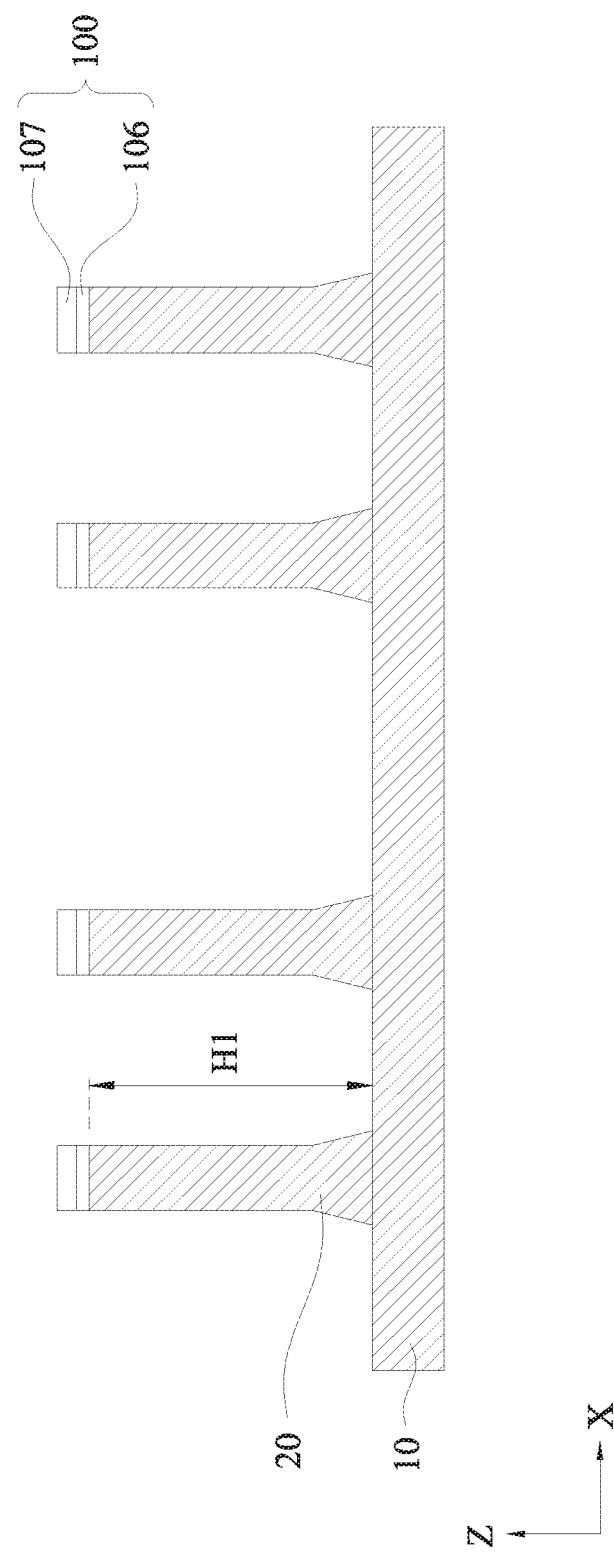
FIG. 2 is an exemplary cross sectional view of one of the various stages of a sequential semiconductor device manufacturing process according to some embodiments of the present disclosure.

By using the mask pattern as an etching mask, a hard mask pattern 100 of the pad oxide layer 106 and the silicon nitride mask layer 107 is formed as shown in FIG. 2.

By using the hard mask pattern as an etching mask, the substrate is patterned into fin structures 20 by trench etching using a dry etching method and/or a wet etching method.

The fin structures 20 disposed over the substrate 10 are made of the same material as the substrate 10 and continuously extend from the substrate 10 in one embodiment. The fin structures 20 may be intrinsic, or appropriately doped with an n-type impurity or a p-type impurity.

In FIG. 2, four fin structures 20 are disposed. These fin structures are used for a p-type Fin FET and/or an n-type Fin FET. The number of the fin structures is not limited to four. The numbers may be as small as one, or more than four. In addition, one of more dummy fin structures may be disposed adjacent both sides of the fin structures 20 to improve pattern fidelity in patterning processes. The width W1 of the fin structures 20 is in a range from about 5 nm to about 40 nm in some embodiments, and is in a range from about 7 nm to about 20 nm in certain embodiments. The height H1 of the fin structures 20 is in a range from about 100 nm to about 300 nm in some embodiments, and is in a range from about 50 nm to 100 nm in other embodiments. When the heights of the fin structures are not uniform, the height from the substrate may be measured from the plane that corresponds to the average heights of the fin structures.

Figure 3:
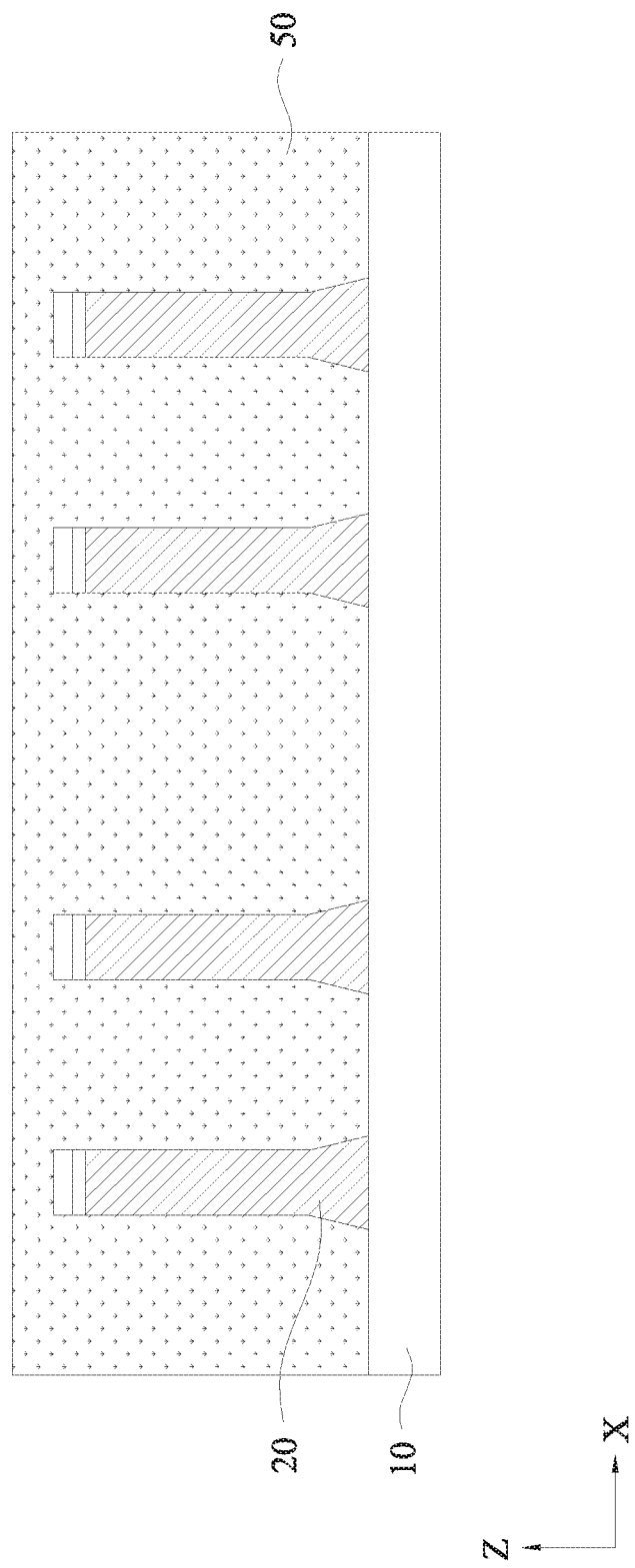
FIG. 3 is an exemplary cross sectional view of one of the various stages of a sequential semiconductor device manufacturing process according to some embodiments of the present disclosure.

As shown in FIG. 3, an insulating material layer 50 to form an isolation insulating layer is formed over the substrate 10 so as to fully cover the fin structures 20.

The insulating material for the isolation insulating layer 50 is made of, for example, silicon dioxide formed by LPCVD (low pressure chemical vapor deposition), plasma-CVD or flowable CVD. In the flowable CVD, flowable dielectric materials instead of silicon oxide are deposited. Flowable dielectric materials, as their name suggest, can "flow" during deposition to fill gaps or spaces with a high aspect ratio. Usually, various chemistries are added to silicon-containing precursors to allow the deposited film to flow. In some embodiments, nitrogen hydride bonds are added. Examples of flowable silicon oxide precursors, particularly flowable silicon oxide precursors, include a silicate, a siloxane, a methyl silsesquioxane (MSQ), a hydrogen silsesquioxane (HSQ), an MSQ/HSQ, a perhydrosilazane (TCPS), a perhydro-polysilazane (PSZ), a tetraethyl orthosilicate (TEOS), or a silyl-amine, such as trisilylamine (TSA). These flowable silicon oxide materials are formed in a multiple-operation process. After the flowable film is deposited, it is cured and then annealed to remove undesired element(s) to form silicon oxide. When the undesired element(s) is removed, the flowable film densifies and shrinks. In some embodiments, multiple anneal processes are conducted. The flowable film is cured and annealed more than once. The isolation insulating layer 50 may be SOG, SiO, SiON, SiOCN or fluorine-doped silicate glass (FSG). The isolation insulating layer 50 may be doped with boron and/or phosphorous.

Figure 4:
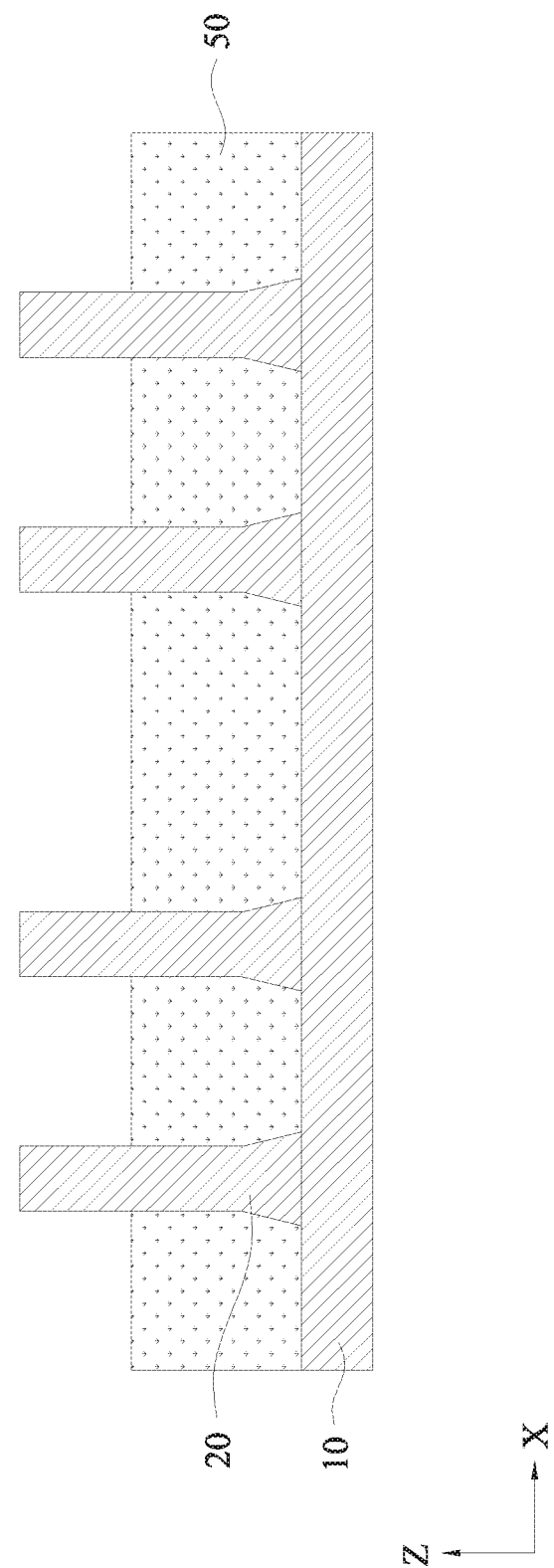
FIG. 4 is an exemplary cross sectional view of one of the various stages of a sequential semiconductor device manufacturing process according to some embodiments of the present disclosure.

After forming the isolation insulating layer 50, a planarization operation is performed so as to remove upper part of the isolation insulating layer 50 and the mask layer 100 including the pad oxide layer 106 and the silicon nitride mask layer 107. Then, the isolation insulating layer 50 is further removed so that an upper part of the fin structures 20, which is to become a channel region, is exposed, as shown in FIG. 4.

After forming the isolation insulating layer 50, a thermal process, for example, an anneal process, is optionally performed to improve the quality of the isolation insulating layer 50. In certain embodiments, the thermal process is performed by using rapid thermal annealing (RTA) at a temperature in a range from about 900° C. to about 1050° C. for about 1.5 seconds to about 10 seconds in an inert gas ambient, for example, $N_2$, Ar or He ambient.

Figure 5A:
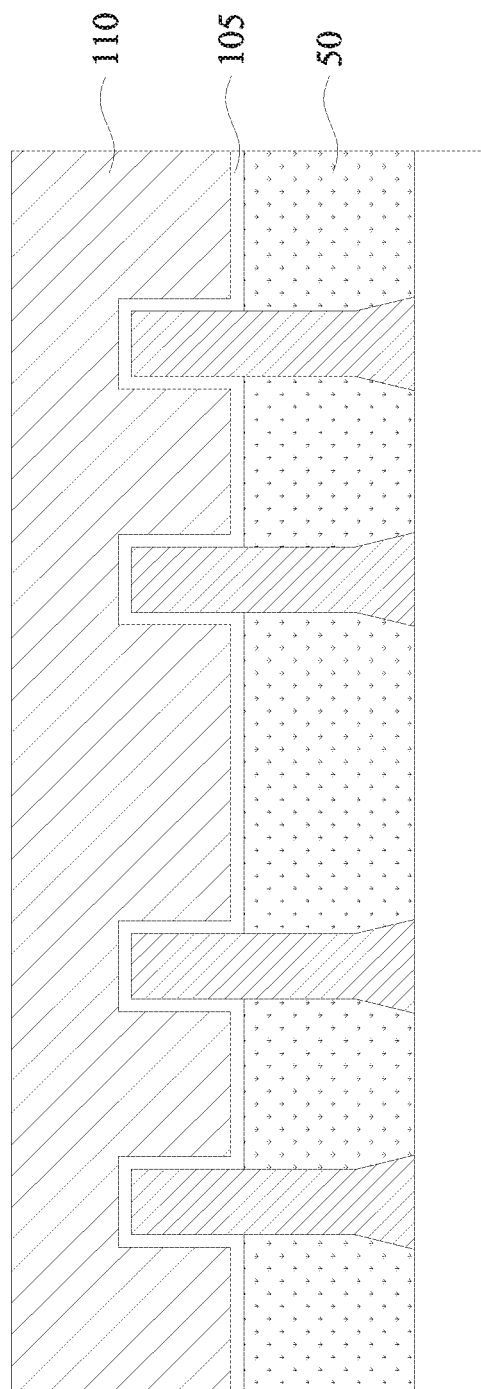
FIGS. 5A-5C are exemplary views of one of the various stages of a sequential semiconductor device manufacturing process according to some embodiments of the present disclosure.
Figure 5B:
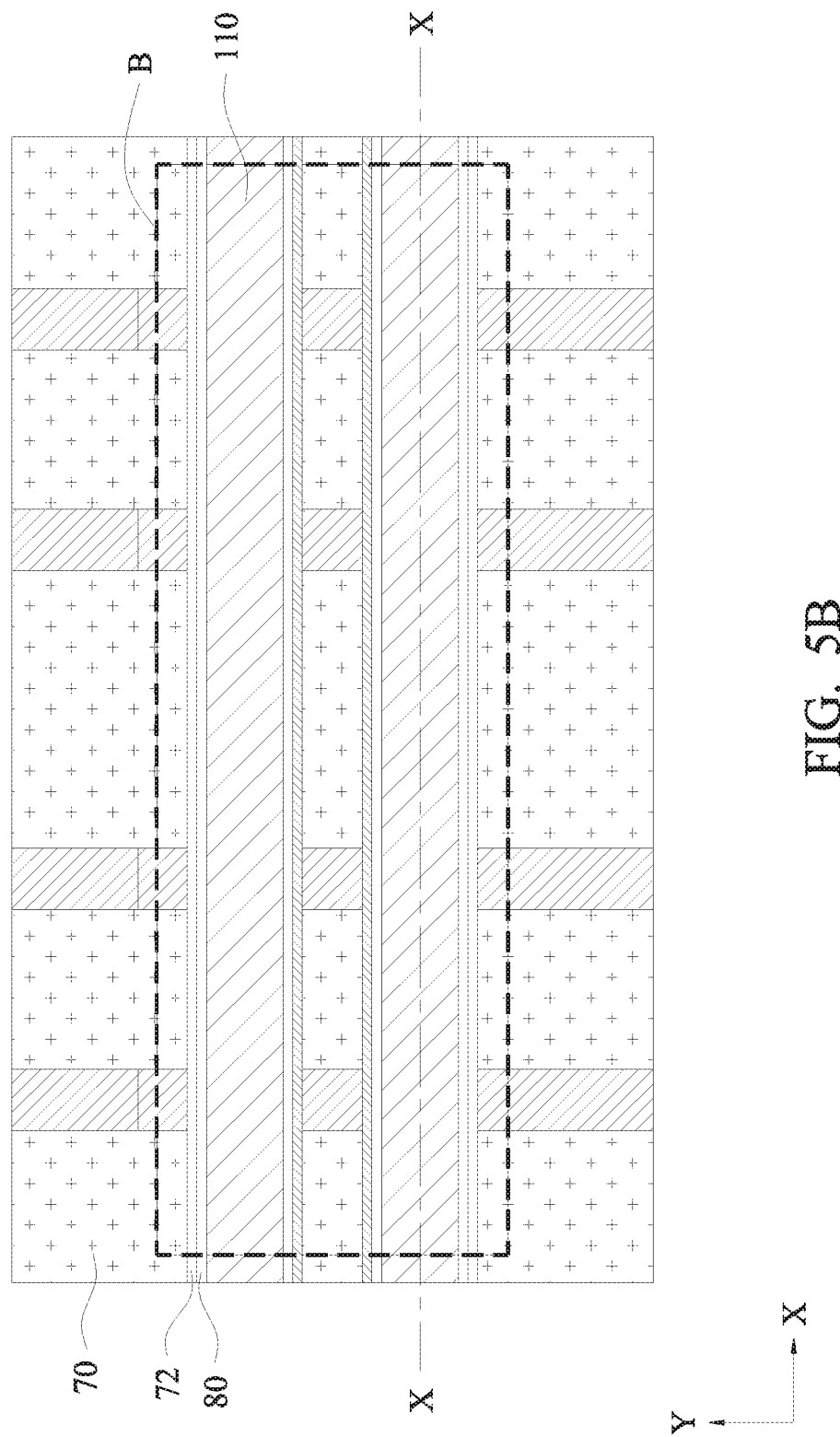
Figure 5C:
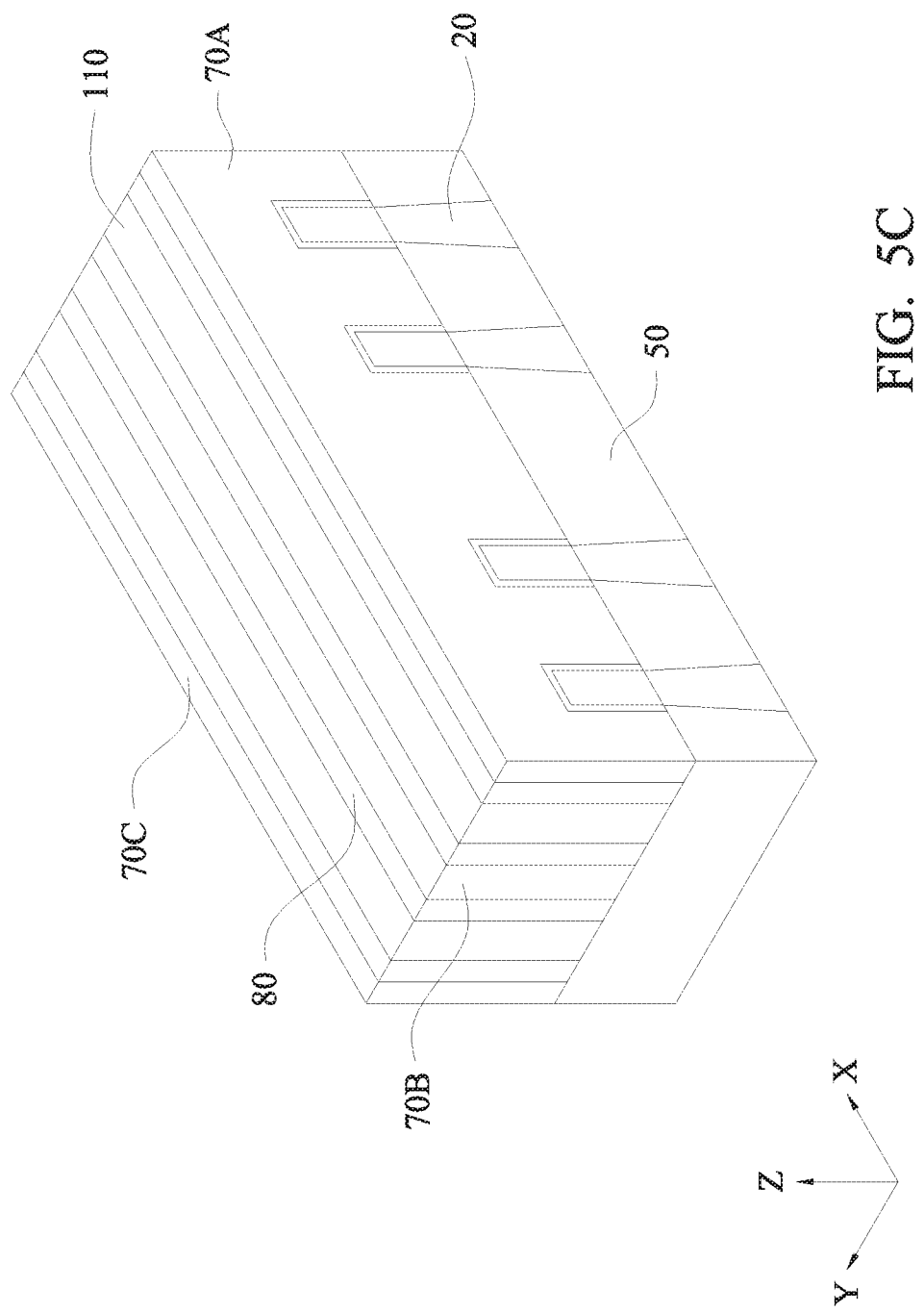

After the upper portions of the fin structures 20 are exposed from the isolation insulating layer 50, a dummy gate insulating layer 105 and a poly silicon layer are formed over the isolation insulating layer 50 and the exposed fin structures 20, and then patterning operations are performed so as to obtain a dummy gate layer 110 made of poly silicon, as shown in FIGS. 5A-5C. The dummy gate insulating layer 105 may be silicon oxide formed by CVD, PVD, ALD, e-beam evaporation, or other suitable process. A thickness of the poly silicon layer is in a range from about 5 to about 100 nm in some embodiments. In the gate replacement technology described with this embodiment, the dummy gate insulating layer 105 and the dummy gate layer 110 are subsequently removed.

After patterning the poly silicon layer, sidewall insulating layers 80 (sidewall spacers) are also formed at both side faces of the gate layer 110. The sidewall insulating layers 80 are made of one or more layers of silicon oxide or silicon nitride based materials such as SiN, SiCN, SiON or SiOCN. In one embodiment, silicon nitride is used.

After the sidewall insulating layers 80 are formed, an insulating layer 72 to be used as a contact-etch stop layer (CESL) is formed over the poly silicon layer 110 and the sidewall insulating layer 80, in some embodiments. The CESL 72 layer may be made of one or more layers of silicon oxide or silicon nitride based materials such as SiN, SiCN, SiON or SiOCN. In one embodiment, silicon nitride is used.

Further, an interlayer dielectric layer (ILD) 70 is formed on the CESL 72 in spaces between the gate layers 110 with the side-wall insulating layers 80 and over the gate layer 110. The ILD 70 may include silicon oxide, silicon nitride, silicon oxynitride (SiON), SiOCN, fluorine-doped silicate glass (FSG), or a low-K dielectric material, and may be made by CVD or other suitable processes. The insulating material for the isolation insulating layer 50 may be the same as or different from that for the ILD 70.

Planarization operations, such as an etch-back process and/or a chemical mechanical polishing (CMP) process, are performed, so as to obtain the structure shown in FIGS. 5A-5C.

FIG. 5B is a plan view (top view) and FIG. 5C is a perspective view of the Fin FET device after the dummy gate layer 110 and the interlayer dielectric layer 70 are formed. FIGS. 2-4 and 5A correspond to cross sectional views along line X1-X1 in FIG. 5B. FIG. 5C corresponds to the enclosed portion B in FIG. 5B.

As shown in FIGS. 5B and 5C, the dummy gate layers 110 are formed in a line-and-space arrangement extending in one direction (X direction) with a constant pitch. The dummy gate layers 110 may include another line-and-space arrangement extending in another direction (Y direction) perpendicular to the one direction, and another line-and-space arrangement with different dimensions.

The dummy gate layers 110 cover the channel regions of the Fin FETs formed with the fin structures 20. In other words, the dummy gate layers 110 are formed over the channel regions. The fin structures not covered by the gate layers will become source/drain regions by appropriate source/drain fabrication operations.

Figure 6A:
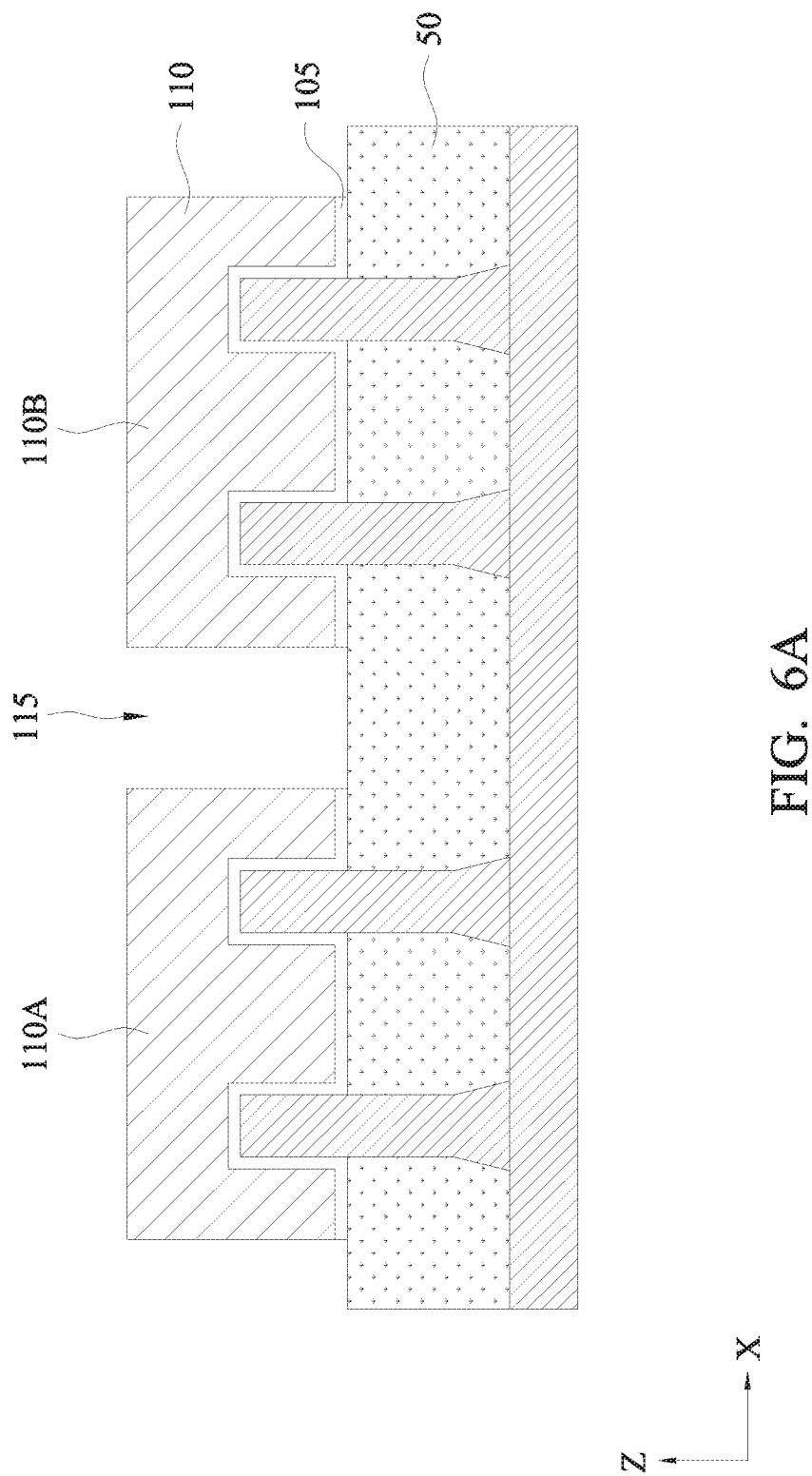
FIGS. 6A and 6B are exemplary views of one of the various stages of a sequential semiconductor device manufacturing process according to some embodiments of the present disclosure.
Figure 6B:
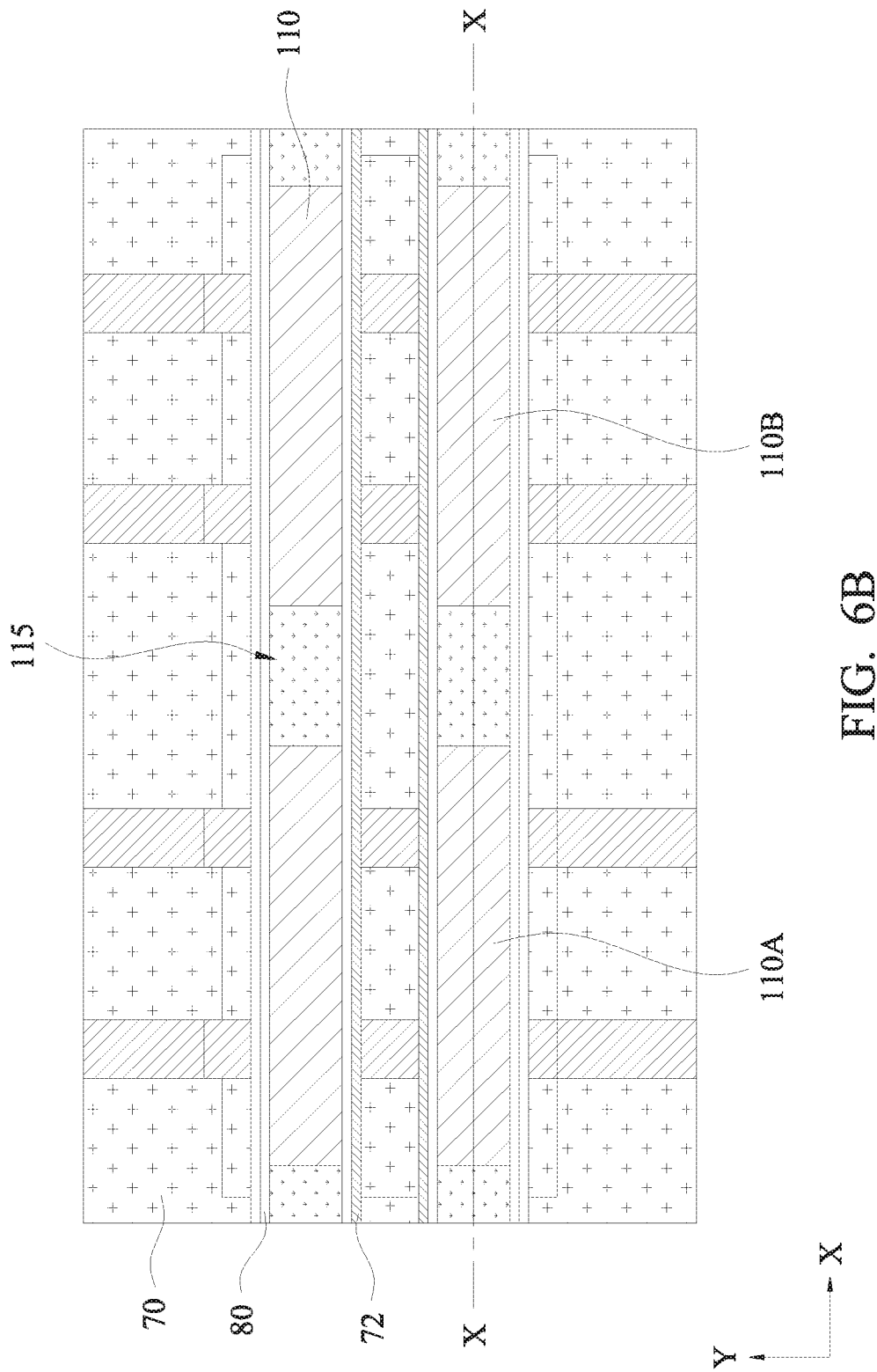

Next, as shown in FIGS. 6A and 6B, after the planarization operation to expose the upper surface of the gate layers 110, the dummy gate layers 110 and the dummy gate insulating layer 105 (i.e., dummy layers) are divided by patterning operations such as a lithography operation and an etching operation, thereby a divided dummy gate layer 110A and a divided dummy gate layer 110B are formed. In some embodiments, a hard mask is used to etch the dummy gate electrode layer and may remain on the top of the first and second divided dummy gate electrode layers. As shown in FIGS. 6A and 6B, an opening 115 is formed between the first and second divided dummy gate layer 110A and 110B.

Figure 7A:
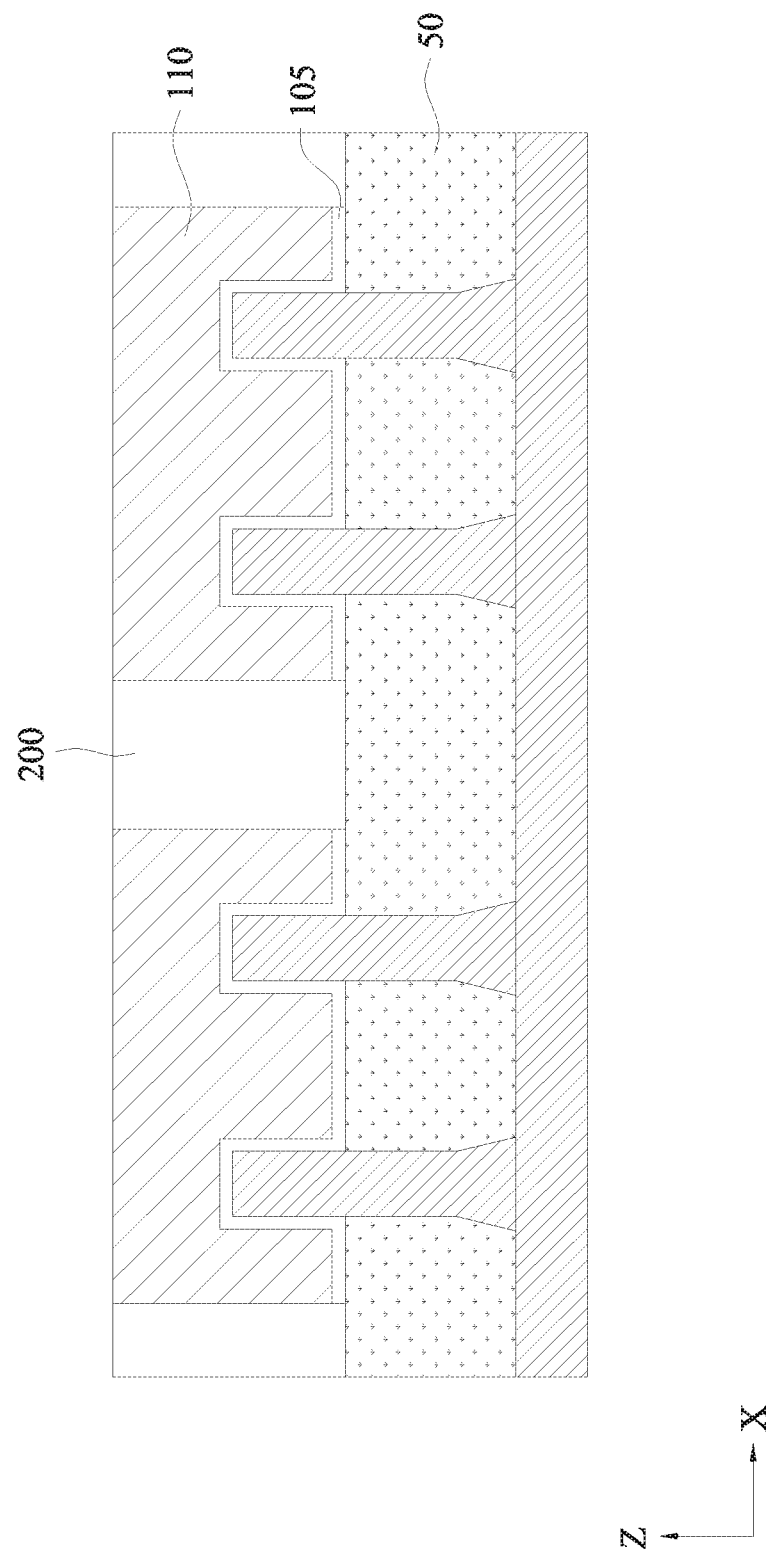
FIGS. 7A and 7B are exemplary views of one of the various stages of a sequential semiconductor device manufacturing process according to some embodiments of the present disclosure.
Figure 7B:
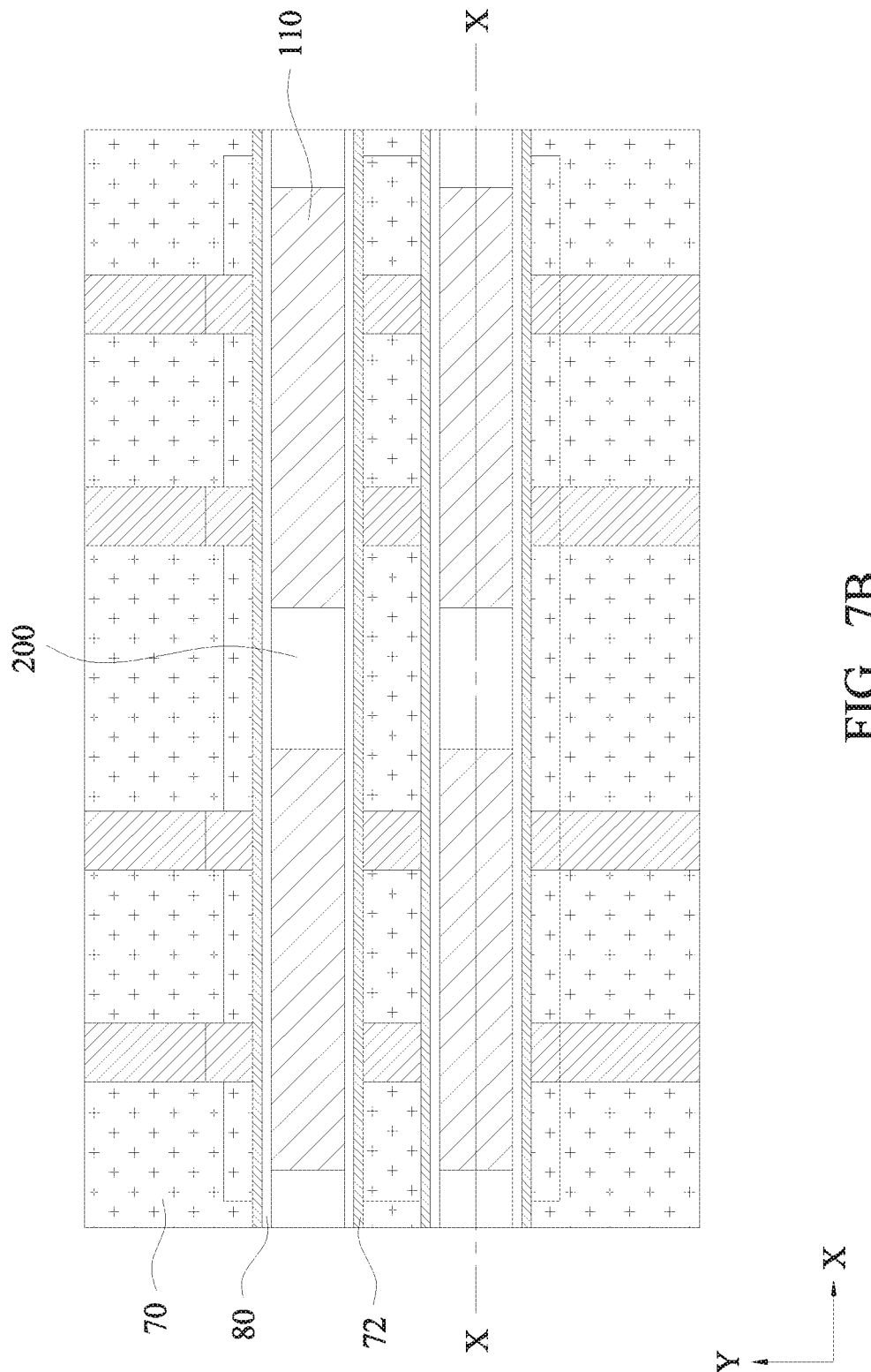

Then, as shown in FIGS. 7A and 7B, a separation plug 200 is formed in the opening 115. To form the separation plug 200, a blanket layer of an insulating material is formed in the opening 115 and over the dummy gate electrode layers 110A, 110B and the ILD layer 70 by using CVD or ALD, and then a planarization operation such as CMP is performed. The CMP is performed to expose the upper surface of the dummy gate electrode layers 110A, 110B, as shown in FIGS. 7A and 7B. By this planarization operation, a separation plug 200 is formed. The separation plug 200 is made of, for example, silicon oxide or silicon nitride based material such as SiN, SiON, SiCN or SiOCN or any other suitable dielectric material.

Figure 8A:
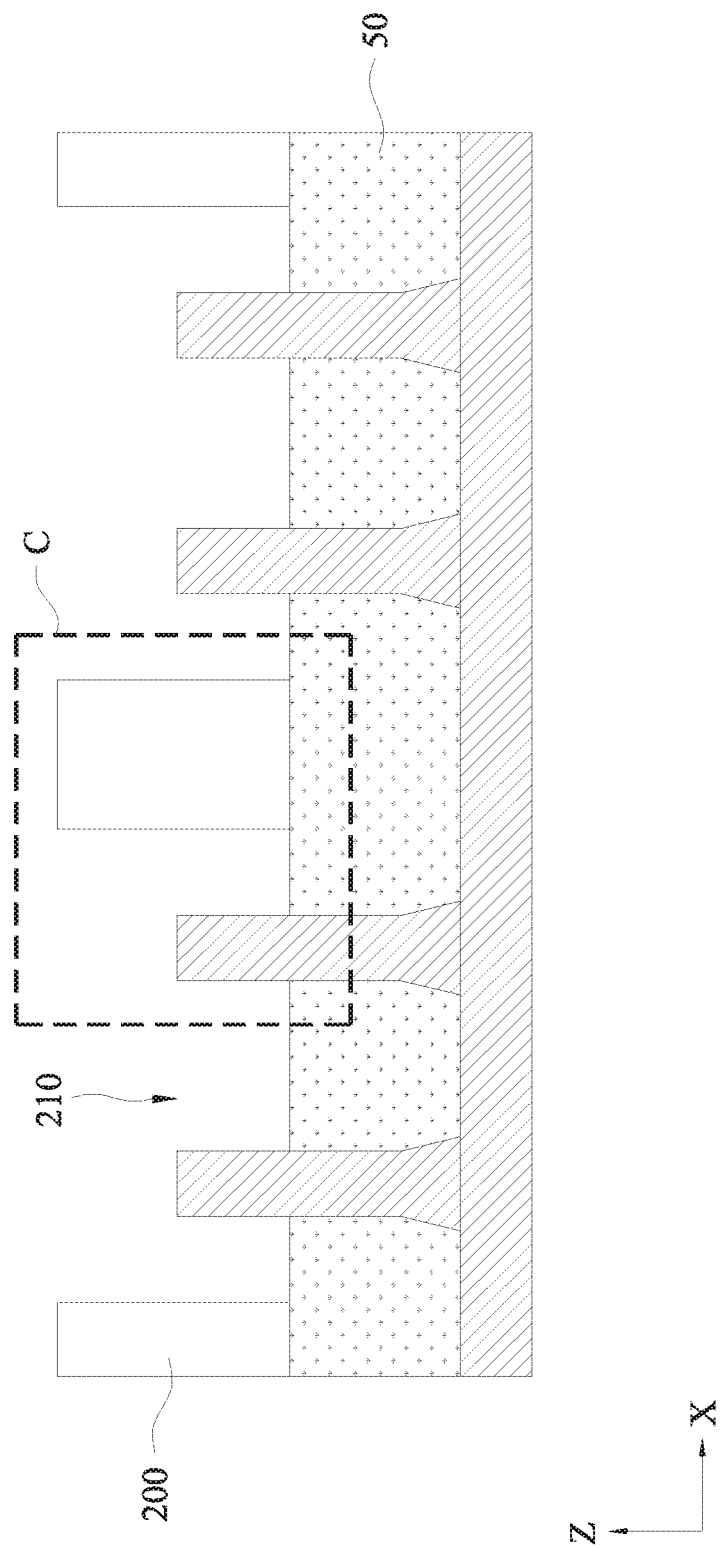
FIGS. 8A, 8B, and 8C are exemplary views of one of the various stages of a sequential semiconductor device manufacturing process according to some embodiments of the present disclosure.
Figure 8B:
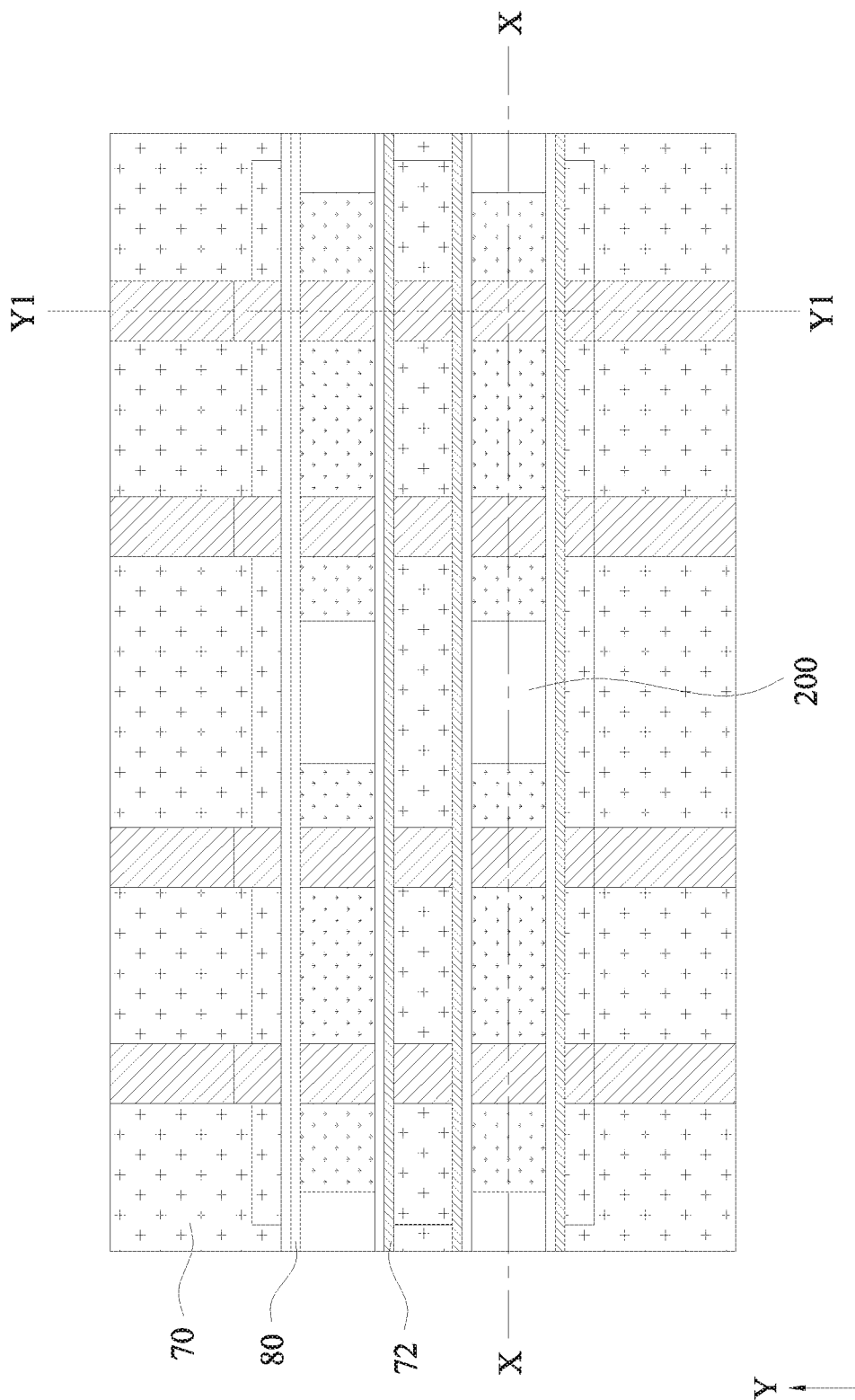
Figure 8C:
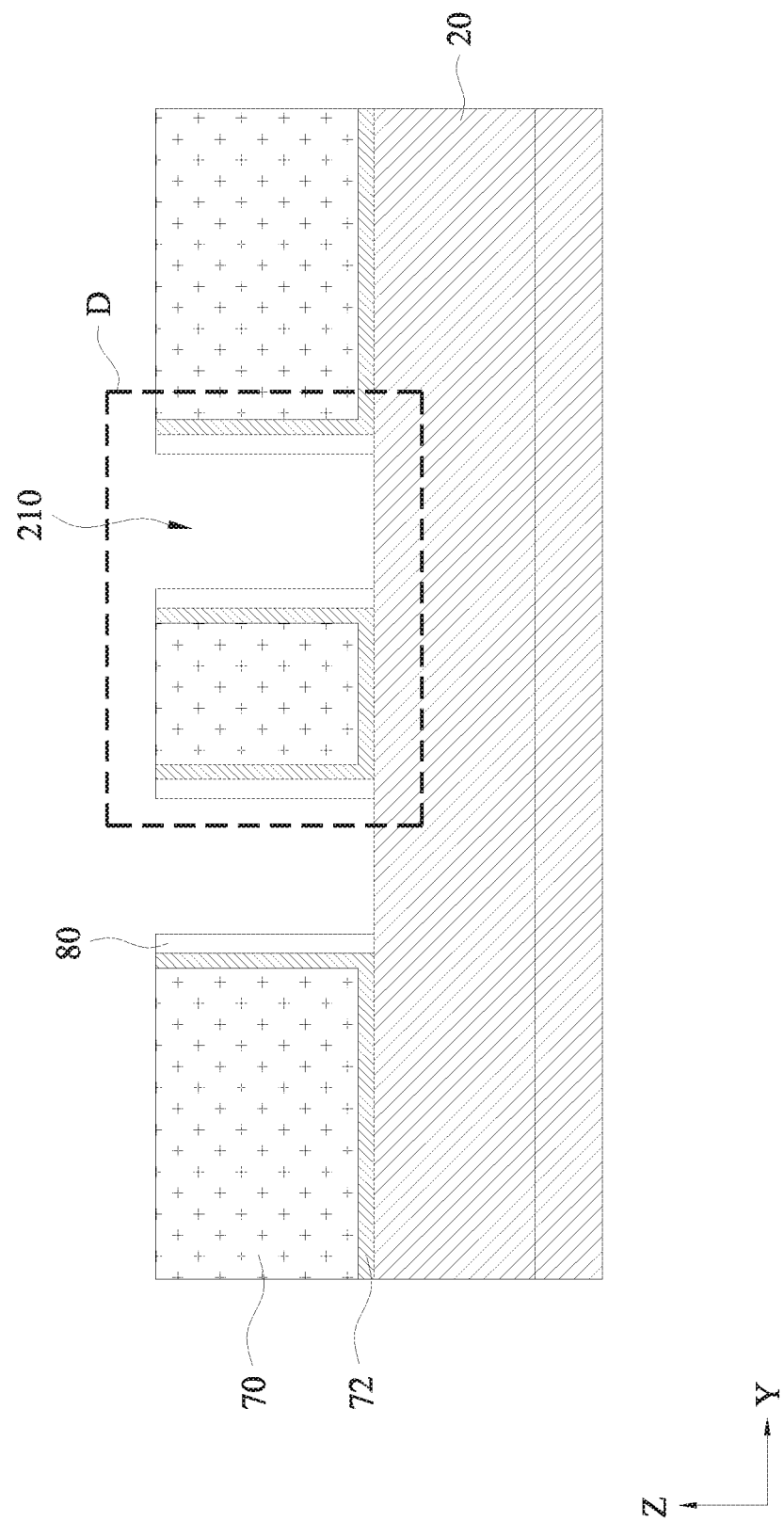

Subsequently, the dummy gate electrode layers 110A and 110B and the dummy gate insulating layer 105 are removed by using dry etching and/or wet etching, thereby forming gate space 210, as shown in FIG. 8A-8C. By removing the dummy gate insulating layer 105, the channel layers 20 (upper portion of the fin structure) are exposed in the gate space 210.

The gate space 210 is constituted by or surrounded by dielectric material portions including separation plugs 200, the sidewall spacers 80 and the isolation insulating layer 50.

In other embodiments, after the dummy gate electrode 110 is formed, the dummy gate electrode layer 110 is divided into the first and second dummy gate electrode layers 110A, 110B, and then sidewall spacers 80 and the ILD layer 170 are formed. In such a case, the separation plug is formed by a part of the spacers and the ILD layer. Further, the gate space is constituted by or surrounded by dielectric material portions including the sidewall spacers 80 and the isolation insulating layer 50.

In FIGS. 9A-10B and 13A-15B, the "A" figures correspond to the area D of FIG. 8C and the "B" figures correspond to the area C of FIG. 8A.

Figure 9A:
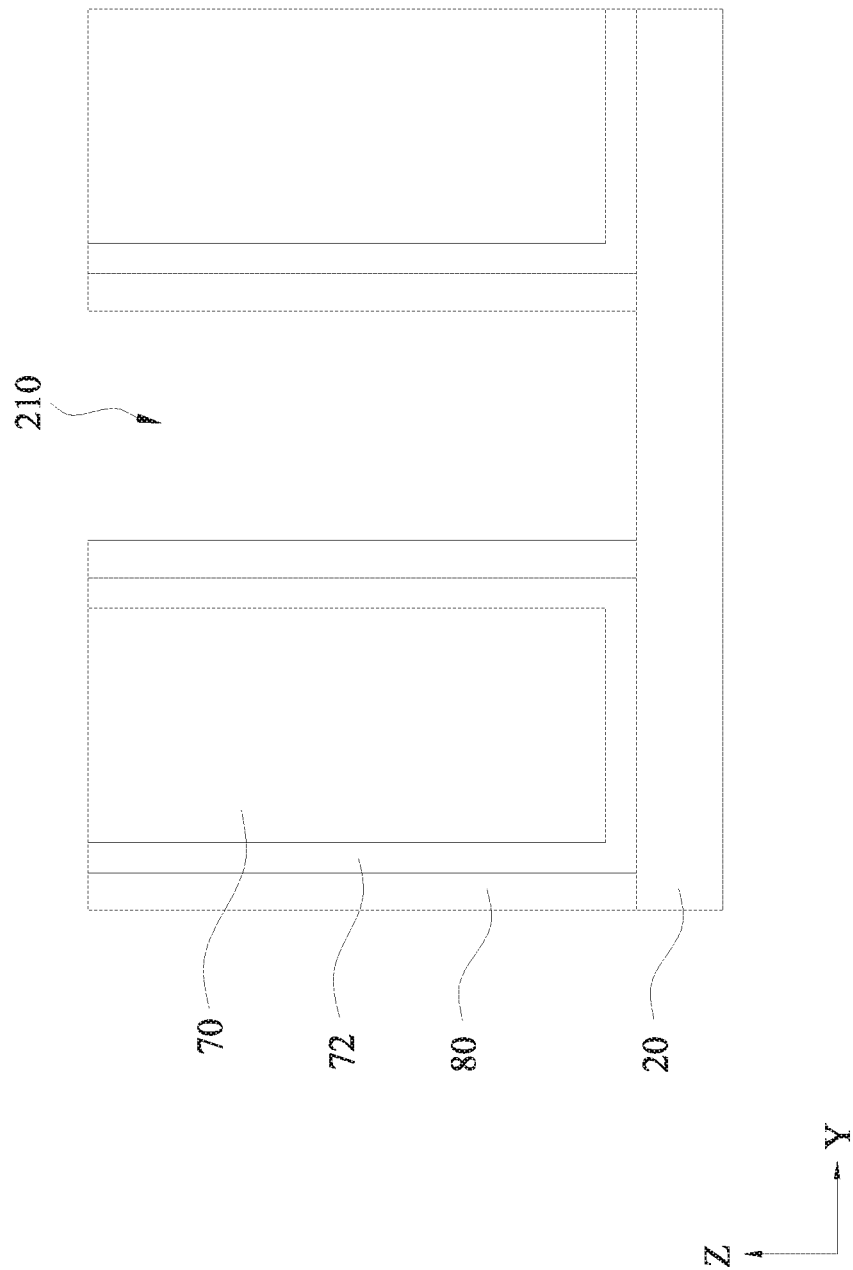
FIGS. 9A and 9B are exemplary cross sectional views of one of the various stages of a sequential semiconductor device manufacturing process according to some embodiments of the present disclosure.
Figure 9B:
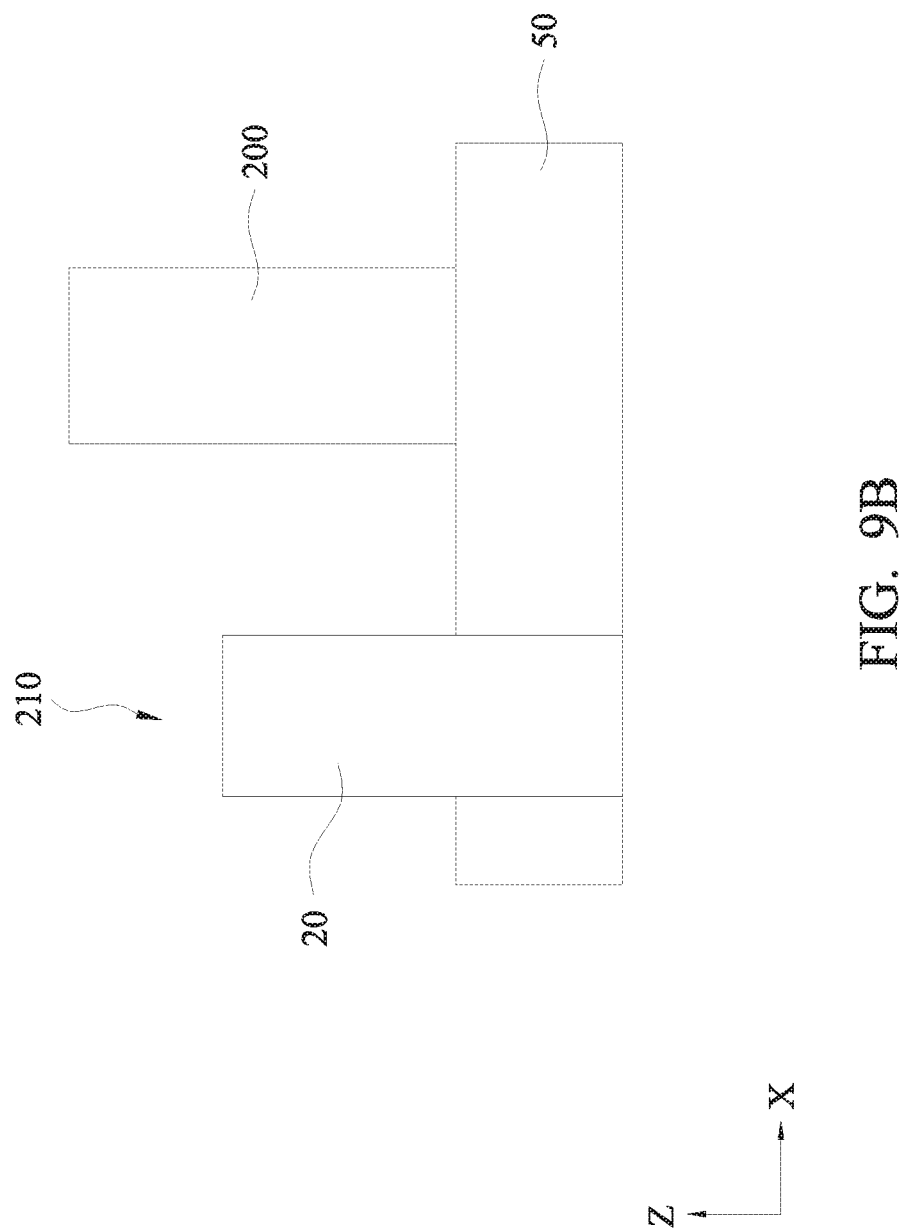

FIGS. 9A and 9B show exemplary cross sectional views after the dummy gate insulating layer 105 is removed. In some embodiments, the dummy gate insulating layer 105 is removed by using dilute HF or buffered HF. The HF etching makes the channel (fin) surface hydrophobic by hydrogen termination, while the surfaces of dielectric portions (e.g., $SiO_2$, SiN) maintains —OH termination, which makes the surfaces hydrophilic.

Figure 11A:
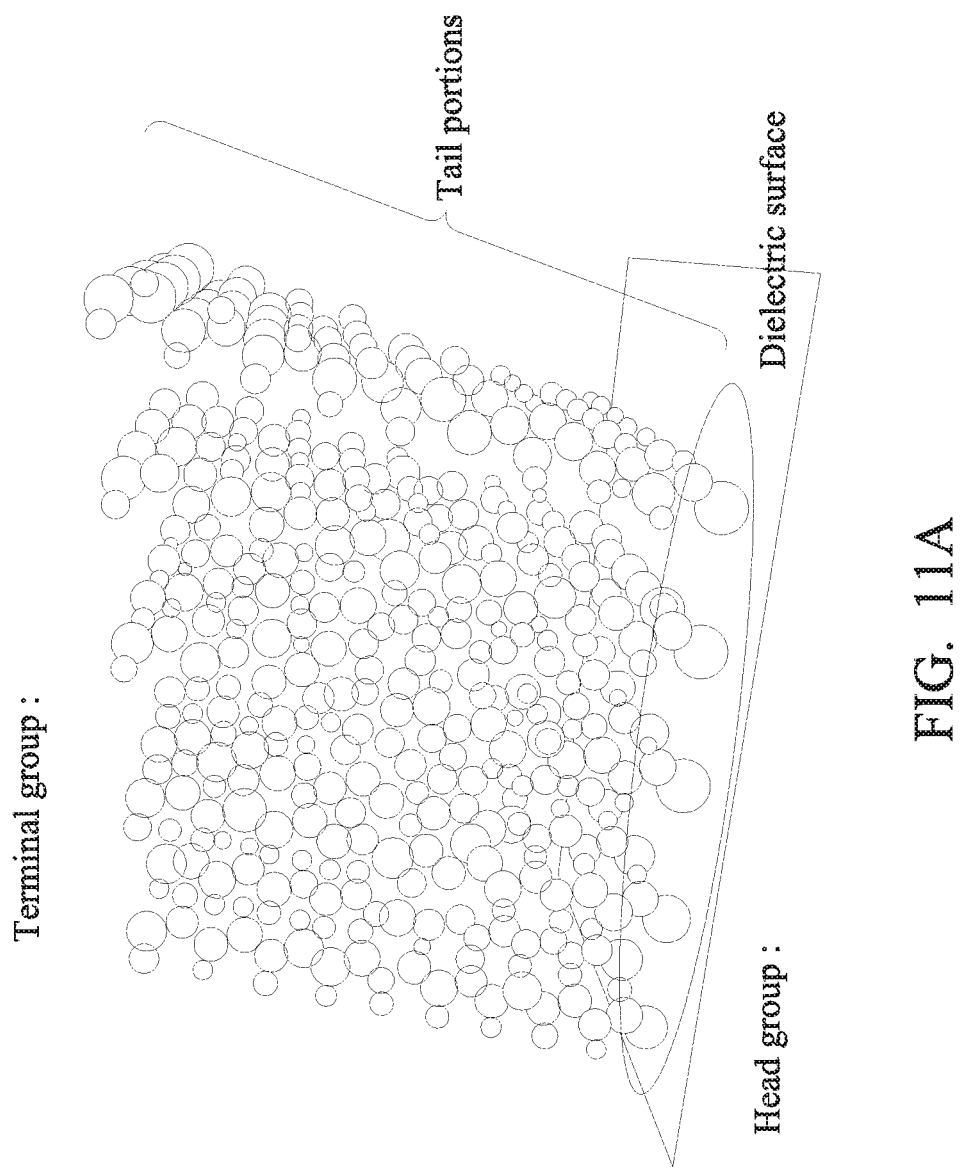
FIG. 11A is an exemplary view of a self-assembled mono layer.
Figure 11C:
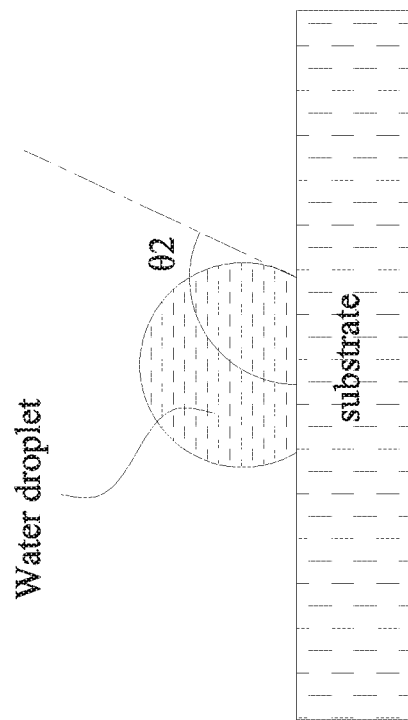
FIGS. 11B and 11C show the difference between hydrophilic and hydrophobic surfaces.
Figure 11B:
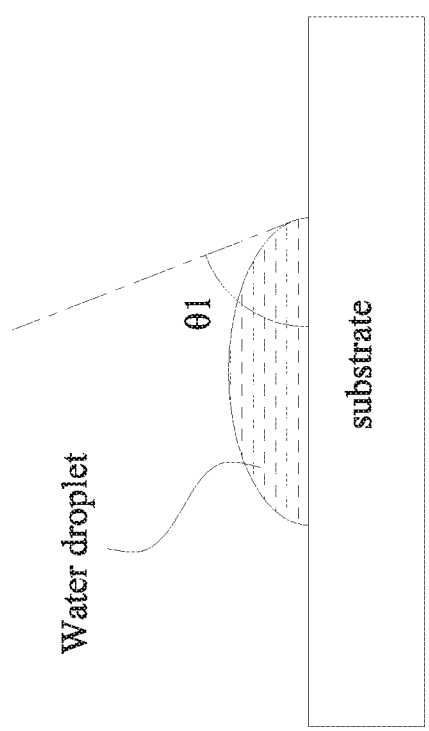

A hydrophilic surface or hydrophilic means, as shown in FIG. 11B, the contact angle θ1 of a water droplet on the surface is smaller than 90 degrees, while a hydrophobic surface or hydrophobic means, as shown in FIG. 11C, the contact angle θ2 of a water droplet on the surface is equal to or greater than 90 degrees (and less than 180 degrees).

Figure 10A:
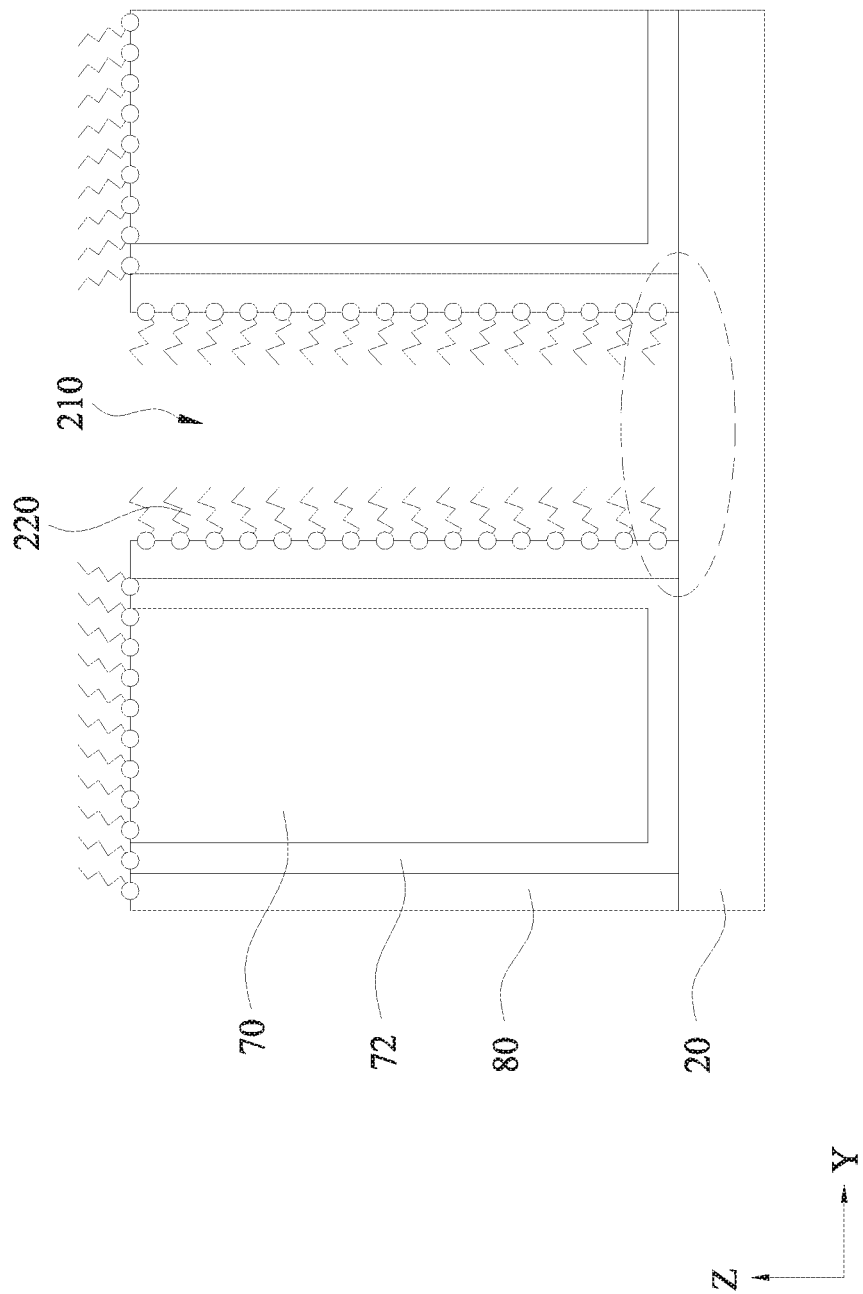
FIGS. 10A and 10B are exemplary cross sectional views of one of the various stages of a sequential semiconductor device manufacturing process according to some embodiments of the present disclosure.
Figure 10B:
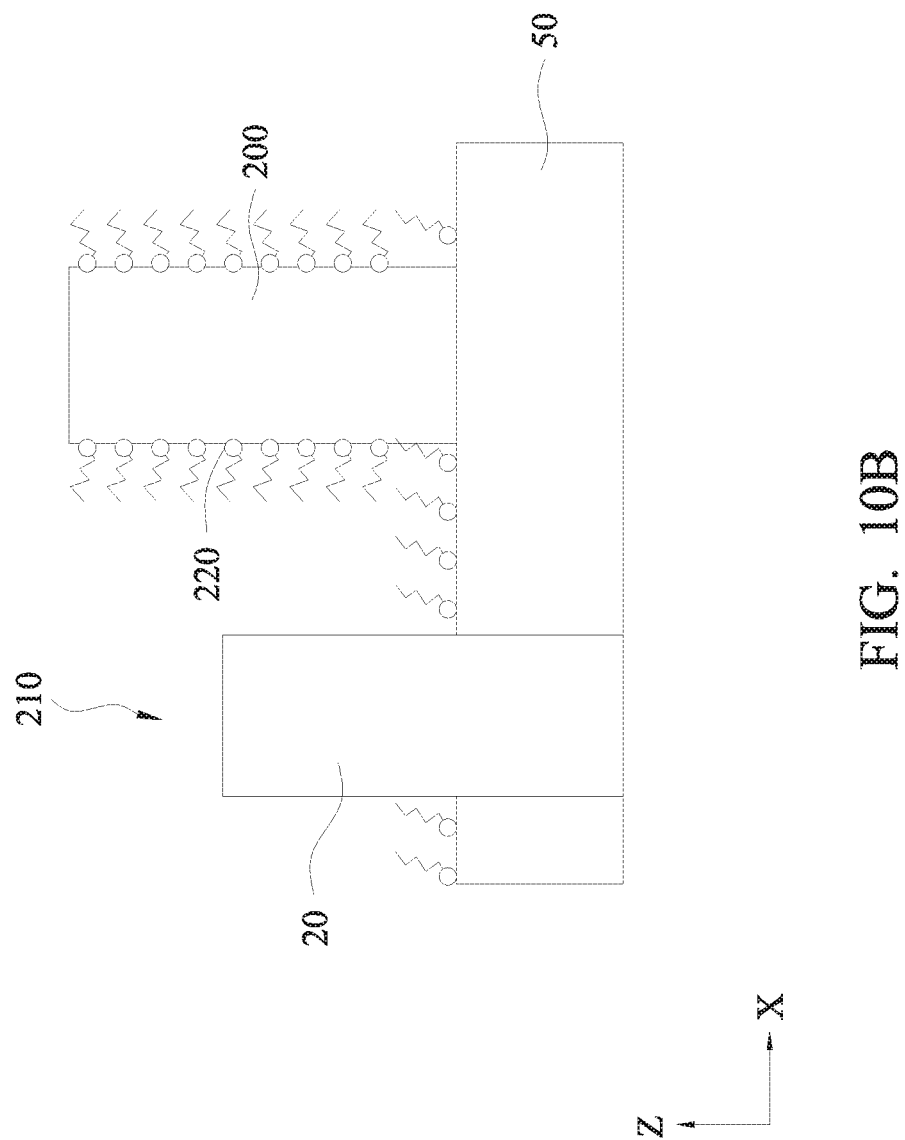

Next, as shown in FIGS. 10A and 10B, a self-assembled-monolayer (SAM) 220 is formed on the surfaces of the dielectric material portions including separation plugs 200, the sidewall spacers 80 and the isolation insulating layer 50, thereby converting the hydrophilic surfaces to hydrophobic surfaces.

The SAM 220 is made of, a silane based compound, such as, phenylethyltrichlorosilane (PETS), mercaptopropyltrimethoxysilane (MPTMS), perfluorodecyltrichlorosilane (FDTS), aminopropyltrimethoxysilane (AMPTS), undecyltrichlorosilane (UTS), aminopropyltriethoxysilane (APTES), aminoethylaminopropyltrimethoxysilane (EDA) or aminoethylaminomethylphenethyltrimethoxysilane (PEDA); a thiol based compound, such as, methylpropanethiol (MPT), octadecanethiol (ODT), hexadecanethiol (HDT), undecanethiol (UDT) or dodecanethiol (DDT); an acid based compound, such as, mercaptohexadecanoic acid (MUDO), or mercaptoundecanoic acid (MUDA); an amine based compound, such as, cysteamine (CYS), trimethoxysilylpropyldiethylenetriamine (DETA) or tetramethylsilyldiethylamine (TMSDMA); and other compounds, such as mercaptoundecanol (MUDO) or hexamethyldisilazane (HMDS). The structural formulas of these materials are shown in FIG. 12.

FIG. 11A shows an exemplary structure of a thiol based SAM. The head groups including sulfur (S) are attached to a surface of the dielectric layers, and the tail portions have an alkane chain terminated by $CH_3$.

The SAM 220 can be formed either by a wet process or a dry process. In the wet process, a substrate to be treated is dipped into a SAM solution, in which the SAM compound is diluted by water, alcohols (e.g., isopropyl alcohol (IPA), ethanol, methanol), or organic solvents (e.g., dimethyl sulfoxide (DMSO), dimethylformamide, propylene carbonate (PC)). The weight ratio of the SAM compound and the dilute solution is 1:0 (no dilution) to 1:10000 in some embodiments. The temperature of the solution is about room temperature (25° C.) to about 120° C. in some embodiments. Acid (e.g., HCl, HF, citric acid) and/or base (e.g., $NH_4OH$, tetramethylammonium (TMAH)) may be added to adjust pH value. The pH value of the SAM solution is about 6.0 to about 8.0 in some embodiments. In the dry process, vaporized SAM material is supplied to the substrate to be treated in a vacuum chamber. The process temperature is about room temperature (25° C.) to about 400° C. in some embodiments. A carrier gas, such as $N_2$, Ar, He and/or $H_2$ may be used. The thickness of the formed SAM 220 is in a range from about 0.2 nm to about 1 nm depending on the SAM material.

As shown in FIGS. 10A and 10B, the SAM 220 is selectively formed on the surface of the dielectric/insulating material layers (separation plugs 200, the sidewall spacers 80 and the isolation insulating layer 50).

After the SAM 220 is formed, the inside surface of the gate space 210 including the channel layers 20 are fully hydrophobic.

Figure 13A:
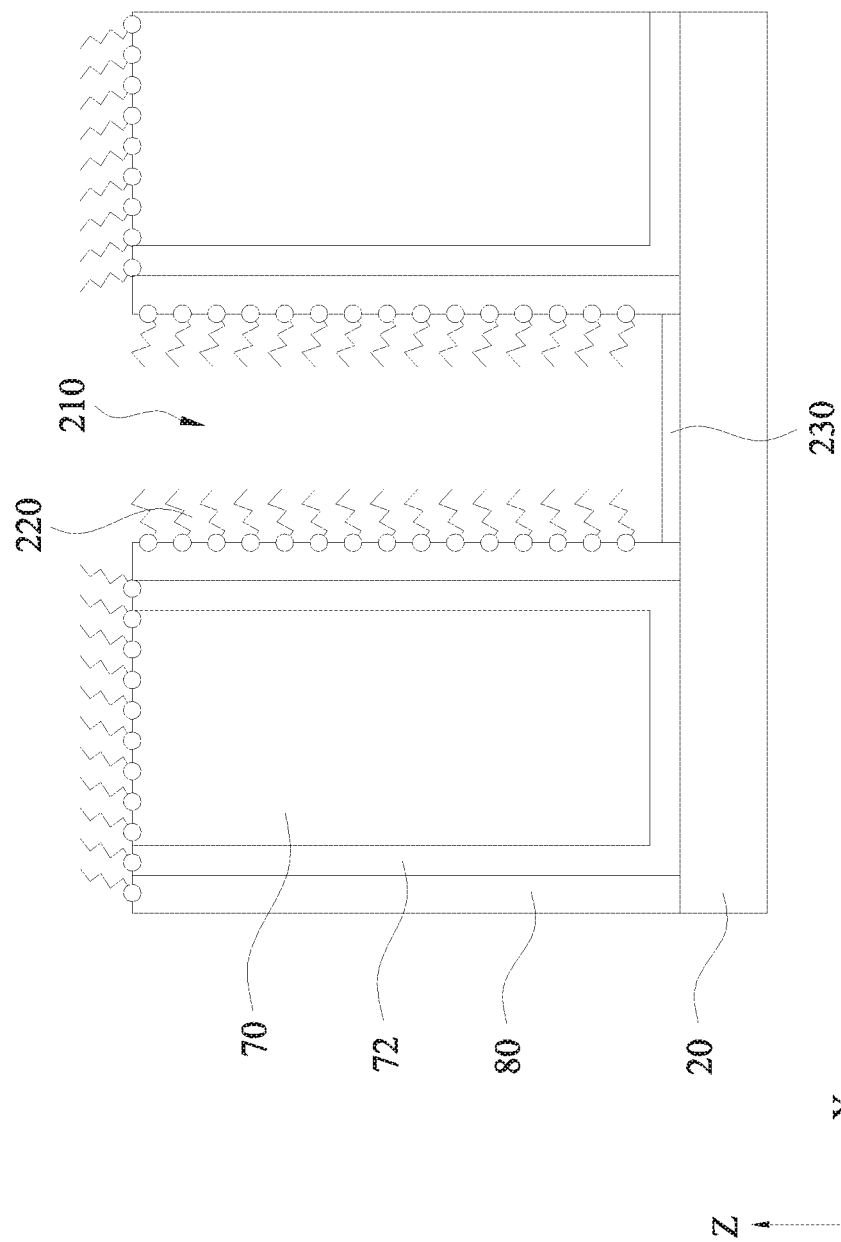
FIGS. 13A and 13B are exemplary cross sectional views of one of the various stages of a sequential semiconductor device manufacturing process according to some embodiments of the present disclosure.
Figure 13B:
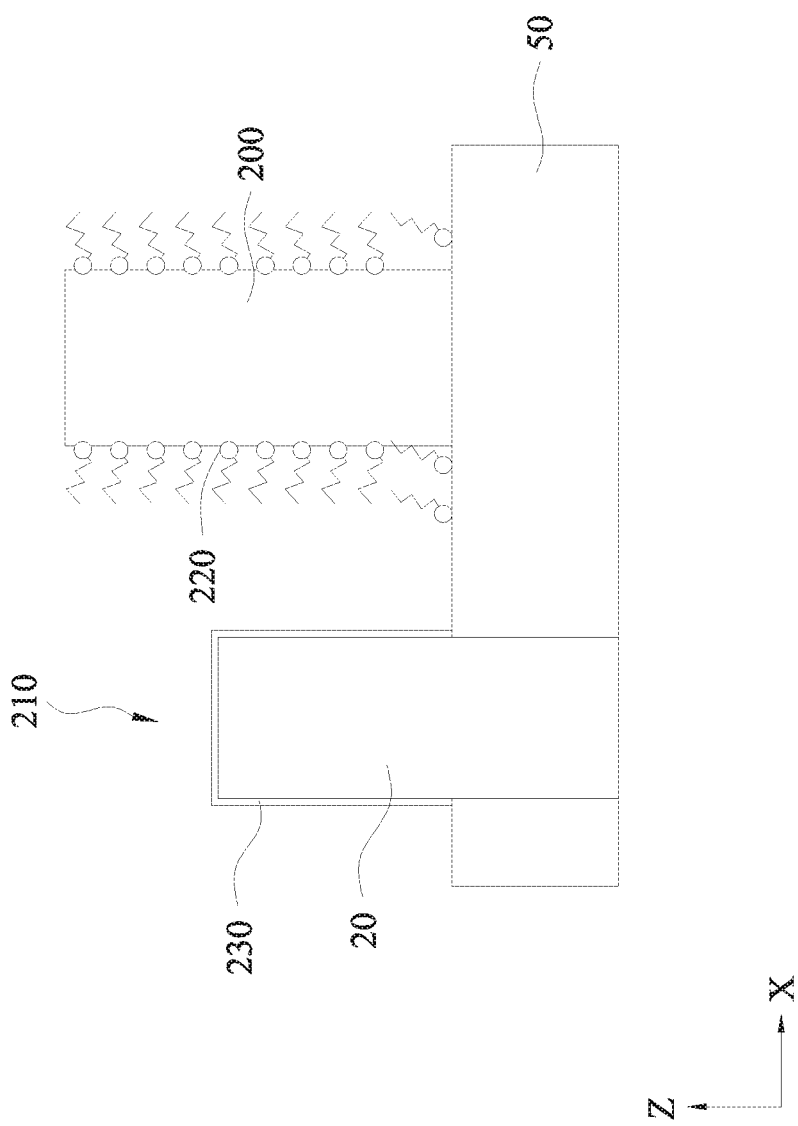

Then, as shown in FIGS. 13A and 13B, the interfacial layer 230 is formed on the surface of the channel layer 20. The interfacial layer 230 is formed by using a wet chemical oxidation, using an aqueous solution containing sulfuric acid ($H_2SO_4$) and hydrogen peroxide ($H_2O_2$) (SPM), ozone water, an aqueous solution containing $NH_4OH$ and $H_2O_2$ (SC1), or an aqueous solution containing HCl and $H_2O_2$ (SC2). By wet chemical oxidation, a thin $SiO_2$ interfacial layer 230 having a thickness of about 0.2 nm to about 2 nm, of which surface is hydrophilic, is formed. The SAM 220 is stably maintained during the wet chemical oxidation.

In other embodiments, instead of forming a $SiO_2$ interfacial layer 230, the surface of the channel layer 20 can be modified to be hydrophilic by using $H_2O_2$ vapor.

Once a hydrophilic surface ($SiO_2$ interfacial layer 230) is formed, a subsequently formed layer can be substantially selectively formed on the hydrophilic surface by using ALD. In some embodiments, by adjusting a process temperature of ALD, a layer is deposited selectively only on the hydrophilic surface.

Figure 14A:
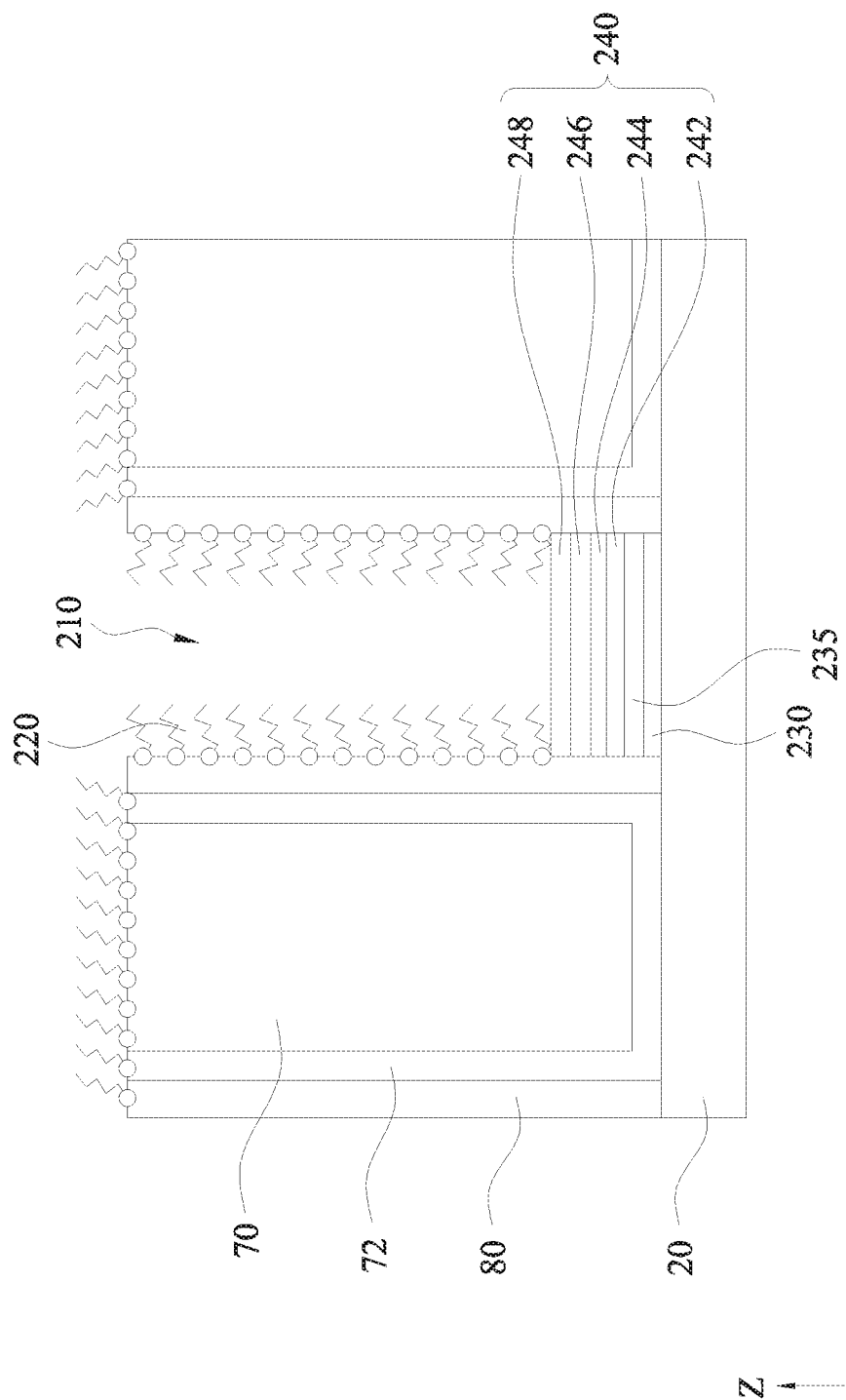
FIGS. 14A and 14B are exemplary cross sectional views of one of the various stages of a sequential semiconductor device manufacturing process according to some embodiments of the present disclosure.
Figure 14B:
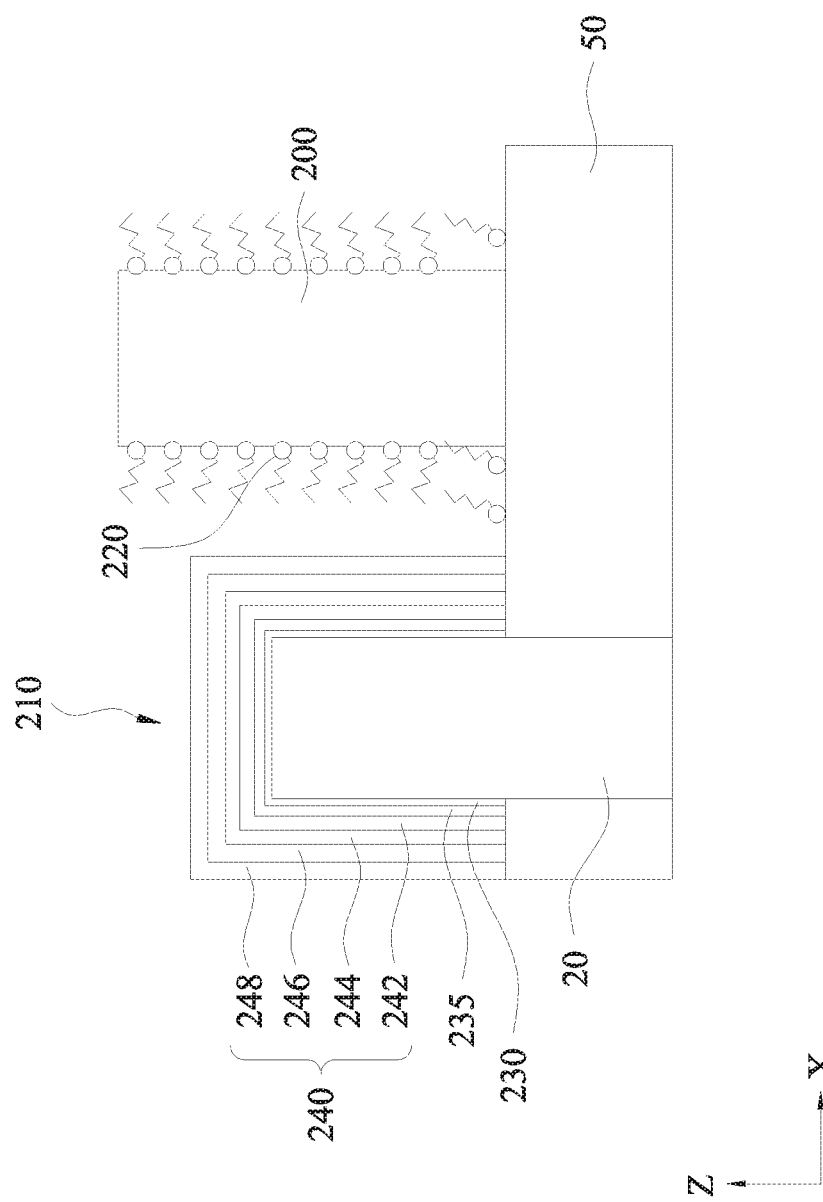

As shown in FIGS. 14A and 14B, after the interfacial layer 230 is formed, a high-k dielectric layer 235 having a thickness about 1 nm to about 20 nm is selectively formed on the interfacial layer 230. The high-k dielectric layer 235 is not substantially formed on side faces of the sidewall spacers 80 (except for the side end face of the high-k dielectric layer 235) and the surface of the separation plug 200. Accordingly, high-k dielectric layer 235 has a substantially uniform thickness (variation is within ±0.5 nm from the average thickness) and does not have a U-shaped cross section along the Y direction.

Here, the U-shaped cross section has thick end portions and a thin center portion. If the surface of the sidewall spacers 80 are not hydrophobic but hydrophilic, the high-k dielectric layer 235 would be conformally formed not only on the interfacial layer 230 but also on the sidewall spacers 80 (and upper portion of the ILD layer 70), forming a U-shape. The U-shaped cross section would make the gate space 210 smaller. However, in the present embodiments, since the high-k dielectric layer 235 is not substantially formed on side faces of the sidewall spacers 80, it is possible to minimize a reduction of the size of the gate space 210. Similarly, since the high-k dielectric layer 235 is not substantially formed on the surface of the separation plug 200, it is possible to minimize a reduction of the size of the gate space 210 in the X direction, in particular a reduction of the distance between the separation plug 200 and the channel 20 closest to the separation plug 200.

Subsequently, one or more conductive underlying layers 240 are formed on the high-k dielectric layer 235 by using ALD. Since the high-k dielectric layer 235 is made of metal oxide, the surface of the high-k dielectric layer 235 is also hydrophilic. Accordingly, the one or more conductive underlying layers 240 can be selectively formed on the high-k dielectric layer 235 without being formed on the sidewall spacers 80 (except for the side end face of the one or more conductive underlying layers 240) and the surface of the separation plug 200, which are hydrophobic.

In some embodiments, the conductive underlying layers 240 include a first conductive layer 242, a second conductive layer 244, a third conductive layer 246 and a fourth conductive layer 248. Each of the one or more conductive underlying layers 240 has a substantially uniform thickness (variation is within ±0.5 nm from the average thickness) and does not have a U-shape cross section along the Y direction. In some embodiments, the first conductive layer 242 is a barrier layer made of TiN, the second conductive layer 242 is an adhesion layer made of Ti, the third conductive layer 244 is a work function adjustment layer and the fourth conductive layer is an adhesion layer 248 for the subsequently formed main electrode layer 250. The number of the conductive underlying layers 240 is not limited to four, and may be as small as one, or greater than four.

Further, as shown in FIG. 14B, none of the high-k dielectric layer 235 and the conductive underlying layers 240 are formed on the surface of the separation plug 200, which is hydrophobic.

Figure 15B:
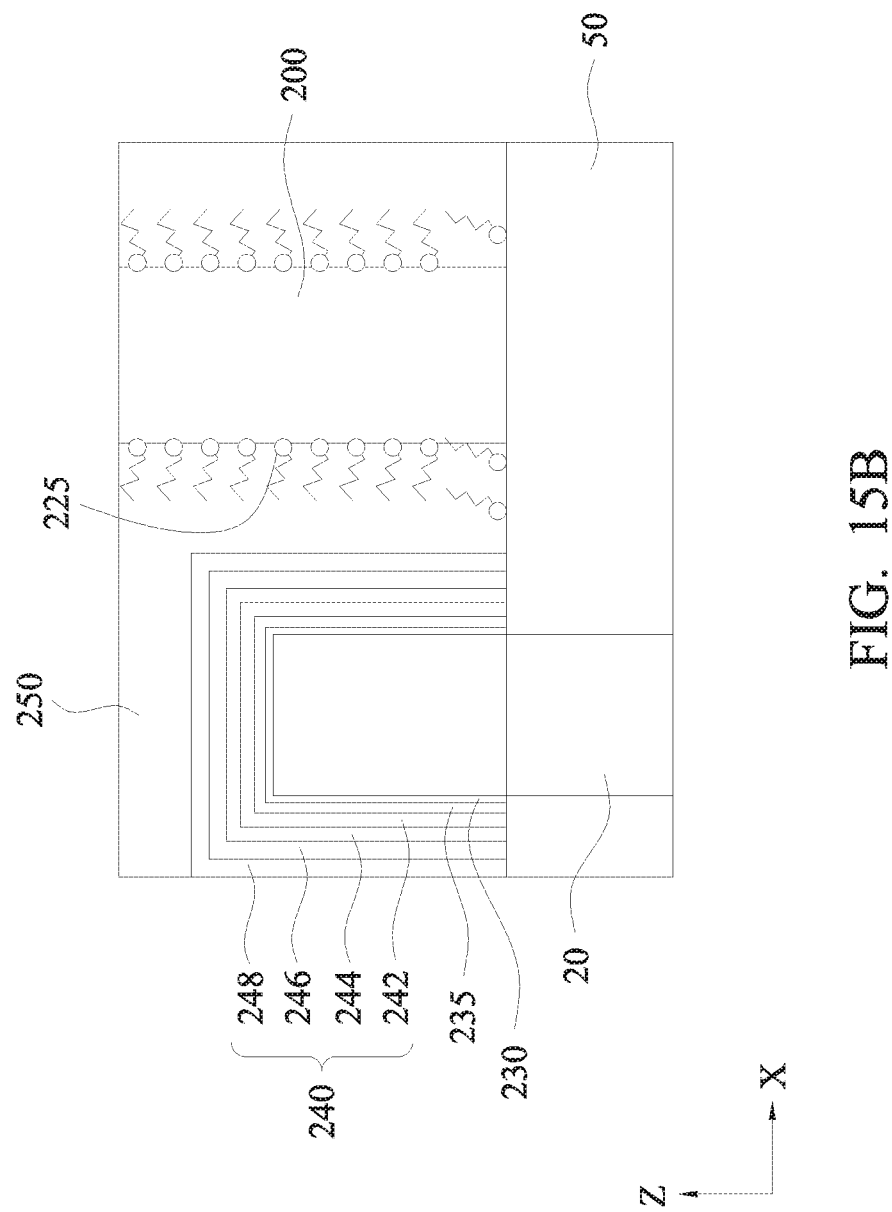

Subsequently, as shown in FIGS. 15A and 15B, the main electrode layer 250 is formed on the one or more conductive underlying layers 240. The main electrode layer 250 can be formed by a suitable film forming method, for example, CVD, PVD, ALD or electroplating. A planarization operation, such as CMP is subsequently performed.

Before the main electrode layer 250 is formed, the SAM layer 220 is removed in some embodiments. The SAM layer 220 can be removed by heating the substrate to about 400° C. to 600° C., or by a plasma treatment. In some embodiments, the SAM layer 220 can be fully removed, and in other embodiments, a residue 225 of the SAM layer 220 remains. In certain embodiments, the head portions of the SAM layer 220 remain as the SAM residue 225. The SAM residue 225 may contain at least one of sulfur, N—H, C—H and atomic Si, and is disposed at an interface between the main electrode layer 250 and the sidewall spacers 80 and/or an interface between the main electrode layer 250 and the separation plug 200.

As shown in FIG. 15B, since none of the high-k dielectric layer 235 and the one or more conductive underlying layers 240 are formed on the surface of the separation plug 200, the main electrode layer 250 is in direct contact with the surface of the isolation insulating layer 50 in a region between the separation plug 200 and the channel 20 closest to the separation plug 200 and in a region between two adjacent channels 20 (see, FIG. 1C).

If the surface of the sidewall spacers 80 are not hydrophobic but hydrophilic, the one or more conductive underlying layers 240 would be conformally formed not only on the high-k dielectric layer 235 (and the conductive layer just previously formed) but also on the sidewall spacers 80 (and upper portion of the ILD layer 70), forming a U-shape. The U-shape cross section would make the gate space 210 smaller. However, in the present embodiments, since none of the one or more conductive underlying layers 240 are formed on side faces of the sidewall spacers 80, it is possible to minimize a reduction of the size of the gate space 210. Similarly, since none of the one or more conductive underlying layers 240 are formed on the surface of the separation plug 200, it is possible to minimize a reduction of the size of the gate space 210 in the X direction, in particular a reduction of the distance between the separation plug 200 and the channel 20 closest to the separation plug 200.

It is understood that the structure shown in FIGS. 15A and 15B undergoes further CMOS processes to form various features such as interconnect vias, interconnect metal layers, passivation layers, etc.

The various embodiments or examples described herein offer several advantages over the existing art. In the above embodiments, by using a SAM, a hydrophobicity of the surfaces on which a subsequent layer is formed is controlled. By making the surface of dielectric portions hydrophobic, it is possible to substantially present a formation of the subsequent layer on the hydrophobic surface. By using this technology, it is possible to minimize a reduction of the size of the gate space. Accordingly, more volume of the main gate electrode layer can be filled in the gate space, thereby reducing the resistance of the gate electrode. Further, it is possible to reduce the distance between a separation plug and a channel layer adjacent to the separation plug. It will be understood that not all advantages have been necessarily discussed herein, no particular advantage is required for all embodiments or examples, and other embodiments or examples may offer different advantages.

In accordance with one aspect of the present disclosure, a semiconductor device includes a fin field-effect transistor (FinFET). The FinFET includes a fin structure extending in a first direction, a gate structure including a gate dielectric layer disposed over the fin structure and a gate electrode layer disposed over the gate dielectric layer, and extending in a second direction crossing the first direction, and sidewall spacers disposed on opposing side faces of the gate structure and made of an insulating material. The gate electrode layer is in contact with the sidewall spacers without interposing the gate dielectric layer therebetween in the first direction.

In accordance with another aspect of the present disclosure, a semiconductor device includes a first fin field-effect transistor (Fin FET) and a second Fin FET. The first Fin FET includes a first fin structure extending in a first direction and a first gate structure. The first gate structure includes a first gate dielectric layer formed over the first fin structure and a first gate electrode layer formed over the first gate dielectric layer, and extends in a second direction perpendicular to the first direction. The second Fin FET includes a second fin structure extending in the first direction and a second gate structure. The second gate structure includes a second gate dielectric layer formed over the second fin structure and a second gate electrode formed over the second gate dielectric layer, and extends in the second direction. The first gate structure and the second gate structure are aligned along the second direction. The first gate structure and the second gate structure are separated by a separation plug made of an insulating material. The first gate electrode layer is in contact with a side wall of the separation plug without interposing the first gate dielectric layer therebetween. Sulfur atoms are disposed at interface between the first gate electrode layer and the side wall of the separation plug.

In accordance with another aspect of the present disclosure, in a method for manufacturing a semiconductor device by using a gate replacement technology, a gate space constituted by dielectric material portions, in which a semiconductor fin channel layer is exposed, is formed. The surfaces of the dielectric material portions are made hydrophobic. A first dielectric layer is formed on the semiconductor fin channel layer, while maintaining the surfaces of the dielectric material portions hydrophobic. A surface of the formed first dielectric layer is hydrophilic. A first conductive layer is formed over the first dielectric layer, while maintaining the surfaces of the dielectric material portions hydrophobic. A second conductive layer is formed over the first conductive layer and on the hydrophobic surfaces of the dielectric material portions, thereby filling the gate space.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device including a fin field-effect transistor (FinFET), the FinFET comprising:
a fin structure extending in a first direction;
a gate structure including a gate dielectric layer disposed over the fin structure and a gate electrode layer disposed over the gate dielectric layer, and extending in a second direction crossing the first direction;
sidewall spacers disposed on opposing side faces of the gate structure and made of an insulating material; and
a plurality of conductive underlying layers disposed between the gate dielectric layer and the gate electrode layer,
wherein each of the plurality of conductive underlying layers has a thickness variation within ±5 nm from an average thickness.

2. The semiconductor device of claim 1, wherein gate dielectric layer includes at least one layer selected from the group consisting of $HfO_2$, $ZrO_2$, $Al_2O_3$, and $La_2O_3$.

3. The semiconductor device of claim 1, wherein the gate electrode layer includes at least one selected from the group consisting of W, Co, Ni, Al, and Cu.

4. The semiconductor device of claim 1, wherein the gate electrode layer is in direct contact with the sidewall spacers.

5. The semiconductor device of claim 1, wherein the plurality of conductive underlying layers comprises a conductive barrier layer.

6. The semiconductor device of claim 5, wherein the plurality of conductive underlying layers comprises a first conductive adhesion layer disposed over the conductive barrier layer.

7. The semiconductor device of claim 6, wherein the plurality of conductive underlying layers comprises a work function adjustment layer.

8. The semiconductor device of claim 7, wherein the plurality of conductive underlying layers comprises a second conductive adhesion layer disposed over the work function adjustment layer.

9. The semiconductor device of claim 1, wherein each of the conductive underlying layers have a substantially uniform thickness above the fin structure.

10. The semiconductor device of claim 1, wherein the plurality of conductive underlying layers include at least one layer selected from the group consisting of Ti, TiN, TaN, and TiSiN.

11. The semiconductor device of claim 1, wherein the gate dielectric layer includes an interfacial layer disposed over the fin structure and a high-k dielectric layer disposed over the interfacial layer.

12. A semiconductor device including a fin field-effect transistor (FinFET), the FinFET comprising:
a fin structure-extending in a first direction;
a gate structure including a gate dielectric layer disposed over the fin structure- and a gate electrode layer disposed over the gate dielectric layer, and extending in a second direction crossing the first direction;
sidewall spacers disposed on opposing side faces of the gate structure and made of an insulating material,
wherein the gate dielectric layer has a thickness variation within ±0.5 nm from an average thickness; and
a plurality of conductive underlying layers disposed between the gate dielectric layer and the gate electrode layer,
wherein each of the plurality of conductive layers are formed of a different material.

13. The semiconductor device of claim 12, wherein each of the conductive underlying layers have a substantially uniform thickness above the fin structure.

14. The semiconductor device of claim 12, wherein the plurality of conductive underlying layers include at least one layer comprising Ti, TiN, TaN, or TiSiN.

15. A semiconductor device including a fin field-effect transistor (FinFET), the FinFET comprising:
a fin structure extending in a first direction;
a gate structure including a gate dielectric layer disposed over the fin structure and a gate electrode layer disposed over the gate dielectric layer, and extending in a second direction crossing the first direction,
wherein the gate electrode layer includes a main metal electrode layer;
sidewall spacers disposed on opposing side faces of the gate structure and made of an insulating material,
wherein the gate dielectric layer has a thickness variation within ±0.5 nm from an average thickness; and
a plurality of conductive underlying layers disposed between the gate dielectric layer and the gate electrode layer,
wherein the main metal electrode layer and each of the plurality of conductive layers are each in direct contact with the sidewall spacers.

16. The semiconductor device of claim 15, wherein the main metal electrode layer comprises at least one of W, Co, Ni, Al, or Cu.

17. The semiconductor device of claim 15, wherein the plurality of conductive underlying layers comprises a conductive barrier layer.

18. The semiconductor device of claim 17, wherein the plurality of conductive underlying layers comprises a first conductive adhesion layer disposed over the conductive barrier layer.

19. The semiconductor device of claim 18, wherein the plurality of conductive underlying layers comprises a work function adjustment layer.

20. The semiconductor device of claim 19, wherein the plurality of conductive underlying layers comprises a second conductive adhesion layer disposed over the work function adjustment layer.

* * * * *